(12) United States Patent
Park et al.

(10) Patent No.: US 9,490,274 B2
(45) Date of Patent: Nov. 8, 2016

(54) THIN FILM TRANSISTOR ARRAY PANEL AND LIQUID CRYSTAL DISPLAY DEVICE INCLUDING THE SAME

(71) Applicant: Samsung Display Co., Ltd., Yongin, Gyeonggi-Do (KR)

(72) Inventors: Hyung Jun Park, Seongnam-si (KR); Kyung-Ho Park, Asan-si (KR); Woo-Jung Shin, Ansan-si (KR); Si Hyun Ahn, Cheonan-si (KR); Dong-Hyun Yoo, Asan-si (KR)

(73) Assignee: SAMSUNG DISPLAY CO., LTD.

( * ) Notice: Subject to any disclaimer, the term of this patent is extended or adjusted under 35 U.S.C. 154(b) by 0 days.

(21) Appl. No.: 14/700,283

(22) Filed: Apr. 30, 2015

(65) Prior Publication Data

US 2015/0236046 A1 Aug. 20, 2015

Related U.S. Application Data

(63) Continuation of application No. 13/546,654, filed on Jul. 11, 2012, now Pat. No. 9,057,921.

(30) Foreign Application Priority Data

Feb. 10, 2012 (KR) .................. 10-2012-0013984

(51) Int. Cl.
*H01L 27/12* (2006.01)
*H01L 29/417* (2006.01)

(52) U.S. Cl.
CPC ....... *H01L 27/124* (2013.01); *H01L 29/41733* (2013.01); *H01L 29/41758* (2013.01)

(58) Field of Classification Search
CPC ............... G02F 2001/134345; G02F 1/13624; G02F 1/136213
USPC .................................................... 349/46, 48
See application file for complete search history.

(56) References Cited

U.S. PATENT DOCUMENTS

| 7,138,656 | B2 | 11/2006 | Yu et al. |
|---|---|---|---|
| 2001/0012076 | A1 | 8/2001 | Ohkawara et al. |
| 2008/0273131 | A1* | 11/2008 | Kim .................... G02F 1/13624 349/38 |
| 2009/0027581 | A1* | 1/2009 | You ..................... G02F 1/13624 349/48 |
| 2009/0086118 | A1* | 4/2009 | Lu .......................... G09G 3/3659 349/48 |
| 2009/0141207 | A1* | 6/2009 | Um ..................... G02F 1/13624 349/46 |
| 2009/0153759 | A1 | 6/2009 | Um et al. |
| 2009/0201455 | A1 | 8/2009 | Murai |
| 2010/0123842 | A1* | 5/2010 | Lee .................. G02F 1/136213 349/39 |
| 2010/0149128 | A1* | 6/2010 | No ...................... G02F 1/13338 345/174 |

(Continued)

FOREIGN PATENT DOCUMENTS

| JP | 2004111866 A | 4/2004 |
|---|---|---|
| KR | 1020000045455 A | 7/2000 |

(Continued)

*Primary Examiner* — Sang V Nguyen
(74) *Attorney, Agent, or Firm* — Cantor Colburn LLP

(57) ABSTRACT

A thin film transistor array panel includes a first substrate; a gate line and a data line on the first substrate; a storage electrode line on the first substrate where a constant voltage is applied thereto; a first thin film transistor and a second thin film transistor which are connected to the gate line and the data line; a third thin film transistor which is connected to the gate line, the second thin film transistor and the storage electrode line; a first subpixel electrode which is connected to the first thin film transistor; and a second subpixel electrode which is connected to the second thin film transistor.

15 Claims, 17 Drawing Sheets

(56) References Cited

U.S. PATENT DOCUMENTS

2010/0225842 A1* 9/2010 Hur .................... G02F 1/13624
                                                        349/48
2011/0170032 A1* 7/2011 Song ................ G02F 1/133707
                                                        349/48
2012/0105785 A1* 5/2012 Kim .................... G09G 3/3648
                                                        349/139

FOREIGN PATENT DOCUMENTS

| KR | 1020060028970 A | 4/2006 |
|---|---|---|
| KR | 1020090069540 A | 7/2009 |
| KR | 1020110076305 A | 7/2011 |
| KR | 1020110078986 A | 7/2011 |
| KR | 1020110095713 A | 8/2011 |

* cited by examiner

THIN FILM TRANSISTOR ARRAY PANEL AND LIQUID CRYSTAL DISPLAY DEVICE INCLUDING THE SAME

This application is a continuation of U.S. patent application Ser. No. 13/546,654 filed Jul. 11, 2012, which claims priority to Korean Patent Application No. 10-2012-0013984 filed on Feb. 10, 2012, and all the benefits accruing therefrom under 35 U.S.C. §119, the entire contents of which are incorporated herein by reference.

BACKGROUND (a) Field

The invention relates to a thin film transistor array panel and a liquid crystal display including the same. More particularly, the invention relates to a thin film transistor array panel in which overlapping areas between gate electrodes and source/drain electrodes are constant even when masks are erroneously aligned during a forming process thereof, and a liquid crystal display including the same.

(b) Description of the Related Art

A liquid crystal display ("LCD") is one of flat panel displays that are widely used. The LCD device is comprised of two substrates with electrodes therein, and a liquid crystal layer interposed therebetween to control the transmittance of light that passes through the liquid crystal layer by applying signals to the electrodes to rearrange liquid crystal molecules of the liquid crystal layer.

The LCD includes a thin film transistor array panel and a common electrode panel which oppose each other. The thin film transistor array panel includes gate lines that transmit a gate signal and data lines that transmit a data signal intersecting with each other, thin film transistors connected to the gate lines and the data lines, and pixel electrodes connected to the thin film transistors. The common electrode panel includes a light blocking member, a color filter, and a common electrode.

However, the LCD has some disadvantages in visibility and a viewing angle, and thus various modes of LCDs have been developed in order to address these disadvantages. While some improvement in the visibility and the viewing angle has been achieved, there are still further challenges in that a desired pattern of elements within the LCD is not properly formed due to misalignment of a mask during a forming process thereof.

In forming the LCD, an overlapping area between the gate electrode and source/drain electrode may be varied due to the misalignment of the mask. Further, when the thin film transistors are formed in a zigzag arrangement with respect to the data lines, the overlapping area between the gate electrode and the source/drain electrode is increased in one region, but the overlapping area between the gate electrode and the source/drain electrode is decreased in another region. Accordingly, a striped pattern may disadvantageously occur in a vertical (e.g., perpendicular) direction to the data line.

SUMMARY

One or more exemplary embodiments of the invention provides a thin film transistor array panel having a constant overlapping area between a gate electrode and a source/drain electrode even when misalignment of a mask used to form the thin film transistor array panel occurs, and a liquid crystal display including the same.

Further, one or more exemplary embodiments of the invention provides a thin film transistor array panel that makes the overlapping area between the gate electrode and the source/drain electrode constant so as to prevent the striped pattern from occurring, and a liquid crystal display including the same.

An exemplary embodiment of the invention provides a thin film transistor array panel, including: a first substrate; a gate line and a data line on the first substrate; a storage electrode line on the first substrate and having a constant voltage applied thereto; a first thin film transistor and a second thin film transistor which are connected to the gate line and the data line; a third thin film transistor which is connected to the gate line, the second thin film transistor and the storage electrode line; a first subpixel electrode which is connected to the first thin film transistor; and a second subpixel electrode which is connected to the second thin film transistor.

The thin film transistor array panel may further include an auxiliary electrode which protrudes from the storage electrode line; a first gate electrode and a second gate electrode which protrude from the gate line and are connected to each other; a first source electrode which protrudes from the data line and overlaps the first gate electrode, and a first drain electrode which is spaced apart from the first source electrode; a second source electrode which is connected to the first source electrode and overlaps the second gate electrode, and a second drain electrode which is spaced apart from the second source electrode; a third gate electrode which protrudes from the gate line in a same direction as the first and second gate electrodes and is spaced apart from the second gate electrode; a third source electrode which is connected to the second drain electrode and overlaps the third gate electrode; and a third drain electrode which is spaced apart from the third source electrode and overlaps the third gate electrode and the auxiliary electrode.

The thin film transistor array panel may further include a connection electrode which connects the third drain electrode and the auxiliary electrode to each other.

The second drain electrode and the third source electrode may be between the second gate electrode and the third gate electrode which are spaced apart from each other.

The first source electrode and the second source electrode may be curved in a 'C' shape.

The first drain electrode and the second drain electrode each may include a first portion having a rod shape, and a second portion which is connected to the first portion and is wider than the first portion. The first portion of first drain electrode may be enclosed by the first source electrode, the first portion of the second drain electrode may be enclosed by the second source electrode, and the second portion of the second drain electrode may be connected to the third source electrode.

The thin film transistor array panel may further include a gate insulating layer on the gate line, the first gate electrode, the second gate electrode and the third gate electrode; and a passivation layer on the first to third source electrodes and on the first to third drain electrodes.

The passivation layer of the thin film transistor array panel may further include a first contact hole which exposes a portion of the first drain electrode; and a second contact hole which exposes a portion of the second drain electrode. The passivation layer and the gate insulating layer may include a third contact hole which exposes a portion of the third drain electrode and the auxiliary electrode.

The thin film transistor array panel may further include a connection electrode which is connected to the third drain electrode and the auxiliary electrode through the third contact hole. The first subpixel electrode may be connected to the first drain electrode through the first contact hole and the second subpixel electrode may be connected to the second drain electrode through the second contact hole.

The portion of the auxiliary electrode exposed by the third contact hole does not overlap the third drain electrode.

The connection electrode may include a same material as the first subpixel electrode and the second subpixel electrode, and may be in a same layer as the first subpixel electrode and the second subpixel electrode.

The thin film transistor array panel may further include an extension electrode which extends from the third gate electrode and is spaced apart from the first gate electrode.

The first drain electrode may include a first portion which has a rod shape, is enclosed by the first source electrode and overlaps the first gate electrode; a second portion which is connected to the first portion, is wider than the first portion and is between the first gate electrode and the extension electrode; and a third portion which is connected to the second portion, has a rod shape, is wider than the second portion and overlaps on the extension electrode.

The thin film transistor array panel may further include a dummy line which overlaps the data line.

The dummy line may be connected to the storage electrode line.

The dummy line may be connected to the connection electrode.

The dummy line may include the same material as the connection electrode, the first subpixel electrode and the second subpixel electrode, and may be in a same layer as the connection electrode, the first subpixel electrode and the second subpixel electrode.

Another exemplary embodiment of the invention provides a liquid crystal display, including: a first substrate and a second substrate; a liquid crystal layer between the first substrate and second substrates; a gate line, a data line and a storage electrode line on the first substrate; a first thin film transistor and a second thin film transistor which are connected to the gate line and the data line; a third thin film transistor which is connected to the gate line, the second thin film transistor and the storage electrode line; a first subpixel electrode which is connected to the first thin film transistor; a second subpixel electrode which is connected to the second thin film transistor; and a common electrode on the second substrate and forming an electric field along with the first and second subpixel electrodes.

The liquid crystal display may further include an auxiliary electrode which protrudes from the storage electrode line; a first gate electrode and a second gate electrode which protrude from the gate line and are connected to each other; a first source electrode which protrudes from the data line and overlaps the first gate electrode, and a first drain electrode which is spaced apart from the first source electrode; a second source electrode which is connected to the first source electrode and overlaps the second gate electrode, and a second drain electrode which is spaced apart from the second source electrode; a third gate electrode which protrudes from the gate line in a same direction as the first and second gate electrodes and is spaced apart from the second gate electrode; a third source electrode which is connected to the second drain electrode and overlaps the third gate electrode; and a third drain electrode which is spaced apart from the third source electrode and overlaps the third gate electrode and the auxiliary electrode.

The liquid crystal display may further include a connection electrode which connects the third drain electrode and the auxiliary electrode to each other. The second drain electrode and the third source electrode may be between the second gate electrode and the third gate electrode which are spaced apart from each other.

One or more exemplary embodiments of the thin film transistor array panel according to the invention and the liquid crystal display including the same have the following advantages.

One more exemplary embodiments of the thin film transistor array panel according to the invention and the liquid crystal display including the same transmit some pixel voltages that are applied to the second subpixel electrode through the third thin film transistor to the storage electrode line so that the voltage of the first subpixel electrode is different from the voltage of the second subpixel electrode, which improves the visibility.

Further, the drain electrode of the second thin film transistor and the source electrode of the third thin film transistor are connected between the two thin film transistors, so that the overlapping area between the gate electrode and the source/drain electrode of the second and third thin film transistors can be constantly maintained in spite of the misalignment of a mask used in forming the thin film transistor array panel.

Furthermore, the drain electrode of the first thin film transistor extends to and overlaps with the extension electrode extending from the gate electrode of the third thin film transistor, so that the overlapping area between the gate electrode and the source/drain electrode of the first thin film transistor can be constantly maintained in spite of the misalignment of the mask.

Finally, the overlapping area between the gate electrode and the source/drain electrode of each of the thin film transistors is constantly maintained, which prevents the striped pattern from occurring.

BRIEF DESCRIPTION OF THE DRAWINGS

The above and other features of this disclosure will become more apparent by describing in further detail exemplary embodiments thereof with reference to the accompanying drawings, in which.

DETAILED DESCRIPTION

Figure 1:
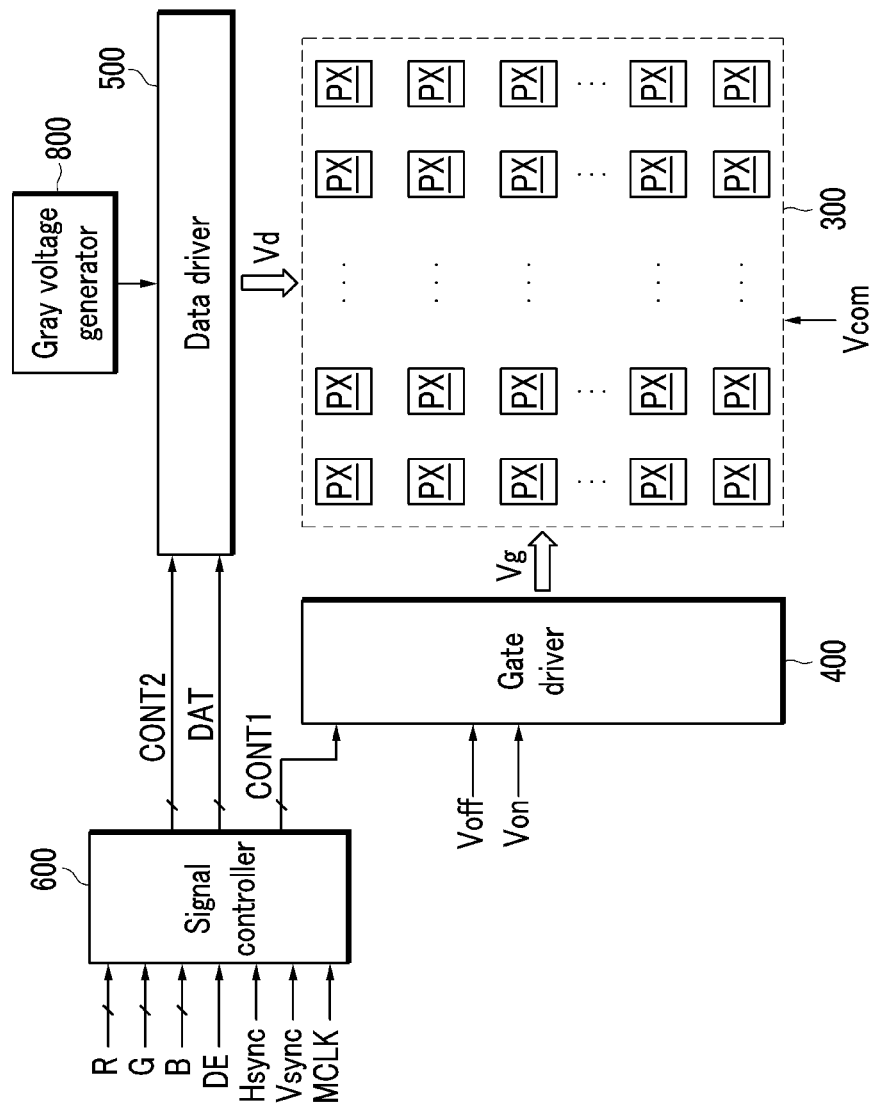
FIG. 1 is a block diagram of an exemplary embodiment of a liquid crystal display according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" relative to the other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A liquid crystal display according to an exemplary embodiment of the invention will be described below with reference to accompanying drawings.

Figure 2:
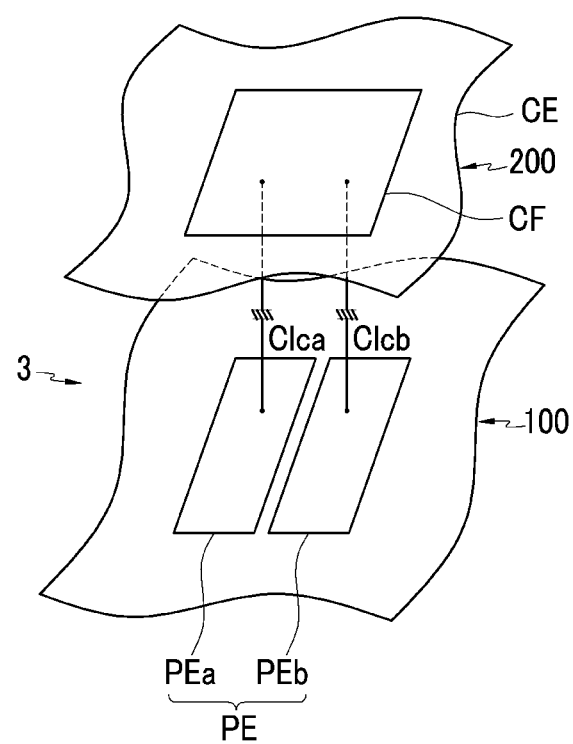
FIG. 2 is an equivalent circuit diagram illustrating an exemplary embodiment of a single pixel together with a structure of a liquid crystal display according to the invention.

FIG. 1 is a block diagram of an exemplary embodiment of a liquid crystal display according to the invention and FIG. 2 is an equivalent circuit diagram illustrating an exemplary embodiment of a single pixel together with a structure of a liquid crystal display according to the invention.

As shown in FIG. 1, an exemplary embodiment of a liquid crystal display according to the invention includes a liquid crystal panel assembly 300, a gate driver 400 and a data driver 500 which are connected to the liquid crystal panel assembly 300, a gray voltage generator 800 connected to the data driver 500, and a signal controller 600 that controls the above components.

In an equivalent circuit, the liquid crystal panel assembly 300 includes a plurality of signal lines (not shown) and a plurality of pixels PX that are connected to the signal lines and arranged substantially in a matrix. Referring to the structure shown in FIG. 2, the liquid crystal panel assembly 300 includes a thin film transistor array panel 100 and an opposite display panel 200 which face each other, and a liquid crystal layer 3 interposed therebetween.

The signal lines include a plurality of gate lines (not shown) that transmit a gate signal (also referred to a "scanning signal") and a plurality of data lines (not shown) that transmits a data signal. The gate lines substantially extend in a row direction (e.g., horizontal in FIG. 1) and are substantially parallel to each other. Further, the data lines substantially extend in a column direction (e.g., vertical in FIG. 1) and are substantially parallel to each other.

Each of the pixels PX includes a pair of subpixels and each of the subpixels includes a liquid crystal capacitor Clca and Clcb. At least one of the two subpixels includes a switching element (not shown) that is connected to a gate line, a data line and the respective liquid crystal capacitor Clca and Clcb.

The liquid crystal capacitors Clca and Clcb include a subpixel electrode PEa/PEb of the thin film transistor array panel 100 and a common electrode CE of the opposite display panel 200 as two terminals, and the liquid crystal layer 3 between the subpixel electrodes PEa/PEb and the common electrode CE functions as a dielectric material. A pair of subpixel electrodes PEa/PEb are separated from each other and constitute a single pixel electrode PE. The common electrode CE is on an entire surface of the opposite display panel 200 and a common voltage Vcom is applied thereto. The liquid crystal layer 3 has a positive dielectric anisotropy. Liquid crystal molecules of the liquid crystal layer 3 are oriented such that the direction of the liquid crystal molecules are twisted at substantially 90° in a state where there is no electric field applied.

In order to materialize color representation, by allowing the pixel PX to uniquely display any one of primary colors (spatial division) or to alternatively display primary colors in accordance with the time (temporal division), a desired color may be recognized by spatial and temporal sums of the primary colors. Examples of the primary colors include three primary colors such as red, green and blue, but the invention is not limited thereto or thereby. FIG. 2 is an example of spatial division and shows that each of the pixels PX includes a color filter CF indicating one of primary colors in a region of the opposite display panel 200. Differently from FIG. 2, the color filter CF may be on or below the subpixel electrodes PEa and PEb of the thin film transistor array panel 100.

At least one polarizer (not shown) that polarizes light is attached onto an outer surface of the liquid crystal panel assembly 300.

Referring to FIG. 1 again, the gray voltage generator 800 generates an entire gray voltage or a limited number of gray voltages (hereinafter, referred to as "reference gray voltages") related to a transmittance of the pixel PX. The (reference) gray voltage may be positive or negative with respect to the common voltage Vcom.

The gate driver 400 is connected to a gate line of the liquid crystal panel assembly 300 to apply a gate signal Vg formed of a combination of a gate-on voltage Von and a gate-off voltage Voff to the gate line.

The data driver 500 is connected to a data line of the liquid crystal panel assembly 300, selects a gray voltage from the gray voltage generator 800 and applies the selected gray voltage to the data line as a data signal. However, when the gray voltage generator 800 does not provide the voltage for all gray levels, but provide a predetermined number of reference gray voltages, the data driver 500 divides the reference gray voltage to generate a gray voltage for all gray levels and then select a data signal from among the generated all gray levels.

The signal controller 600 includes an image signal converter (not shown) and controls the gate driver 400 and the data driver 500. The signal controller 600 may convert first control signals R, G, B, DE, Hsync, Vsync and MCLK, into second control signals CONT1, DAT and CONT2, and provide the second control signals CONT1, DAT and CONT2 to the gate driver 400 and the data driver 500, respectively.

Such drivers 400, 500, 600 and 800 may be directly on the liquid crystal panel assembly 300 so as a form of at least one integrated circuit ("IC") chip, may be on a flexible printed circuit film (not shown) which is attached on the liquid crystal panel assembly 300 as a form of a tape carrier package ("TCP"), or may be on a separate printed circuit board ("PCB") (not shown). Alternatively, the above-mentioned drivers 400, 500, 600 and 800 may be integrated in the liquid crystal panel assembly 300 together with the signal lines and the thin film transistor switching element. Further, the drivers 400, 500, 600 and 800 may be integrated as a single chip. In this case, at least one driver or at least one circuit element that constitutes the driver, may be disposed outside the single chip.

Next, an exemplary embodiment of a liquid crystal display according to the invention will be further described with reference to FIGS. 3 to 7 in addition to FIG. 1 and FIG. 2.

Figure 3:
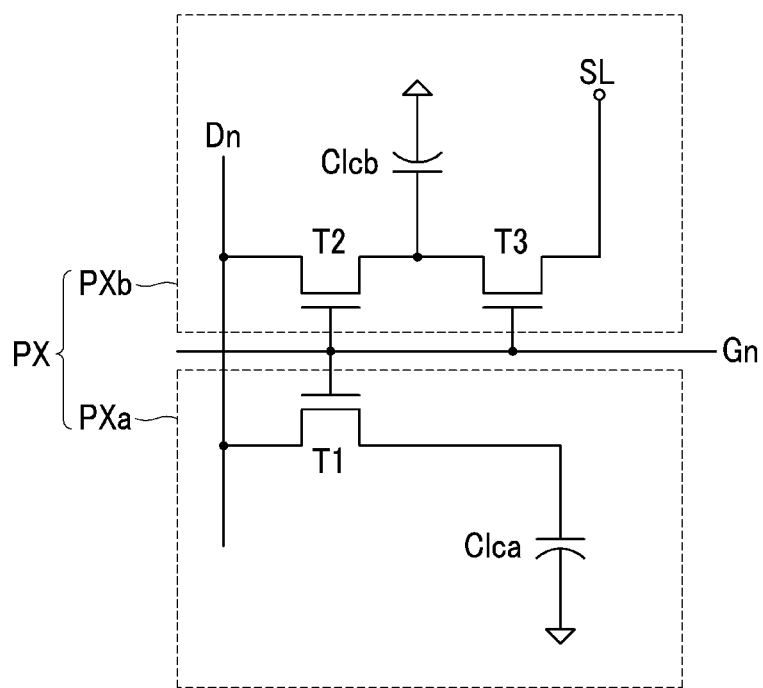
FIG. 3 is an equivalent circuit diagram of an exemplary embodiment of a single pixel of a liquid crystal display according to the invention.
Figure 4:
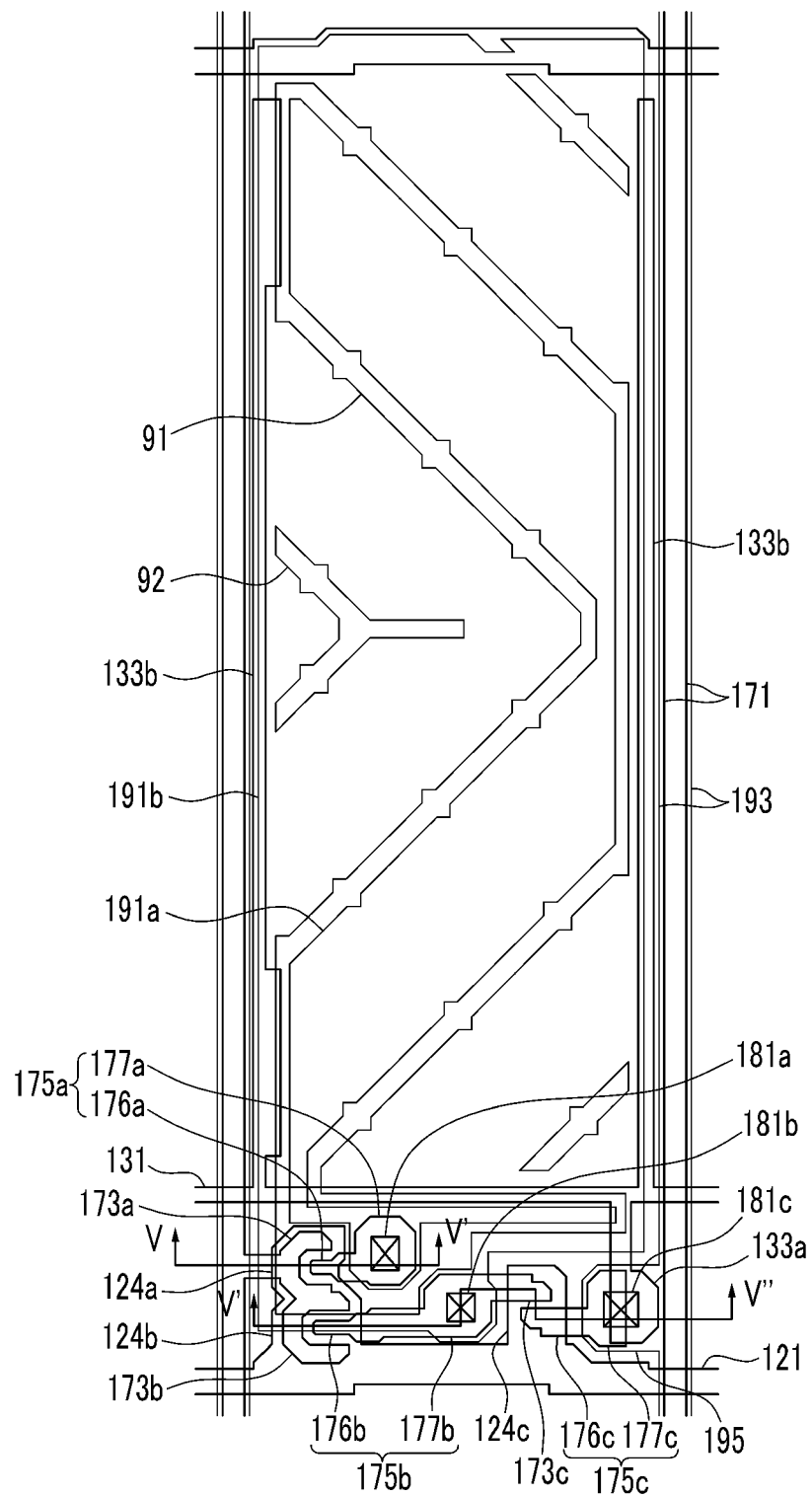
FIG. 4 is a top plan view of an exemplary embodiment of a thin film transistor array panel of a liquid crystal display according to the invention.
Figure 5:
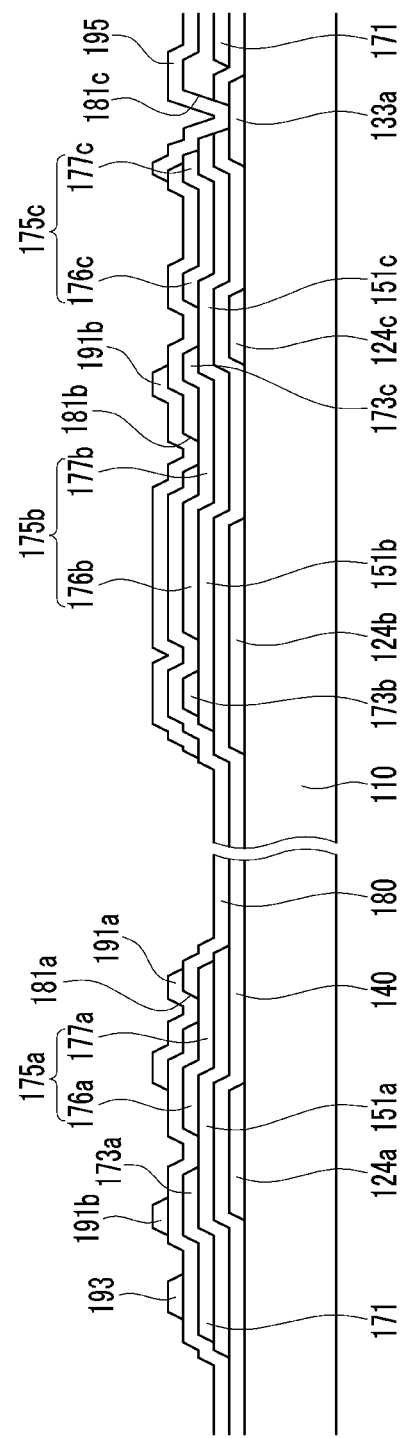
FIG. 5 is a cross-sectional view of the thin film transistor array panel of the liquid crystal display taken along lines V-V' and V'-V" of FIG. 4.
Figure 6:
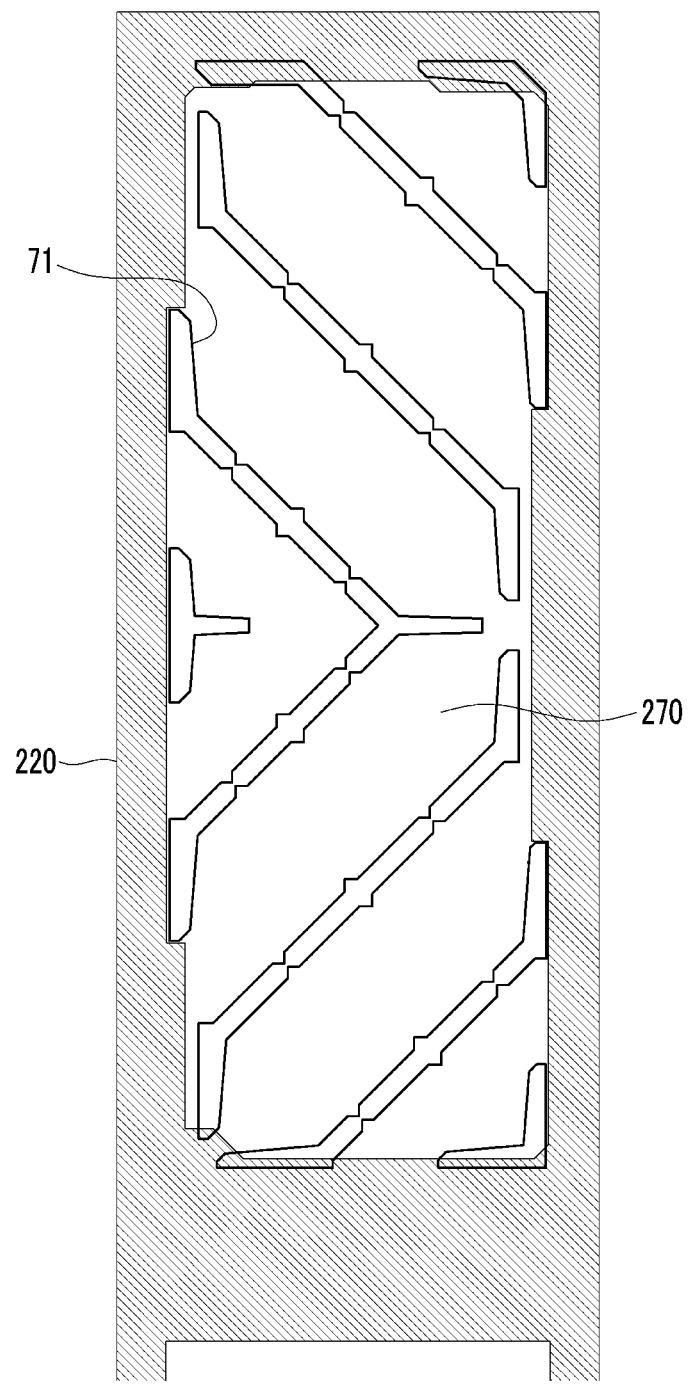
FIG. 6 is a top plan view of an exemplary embodiment of an opposite display panel of a liquid crystal display according to the invention.
Figure 7:
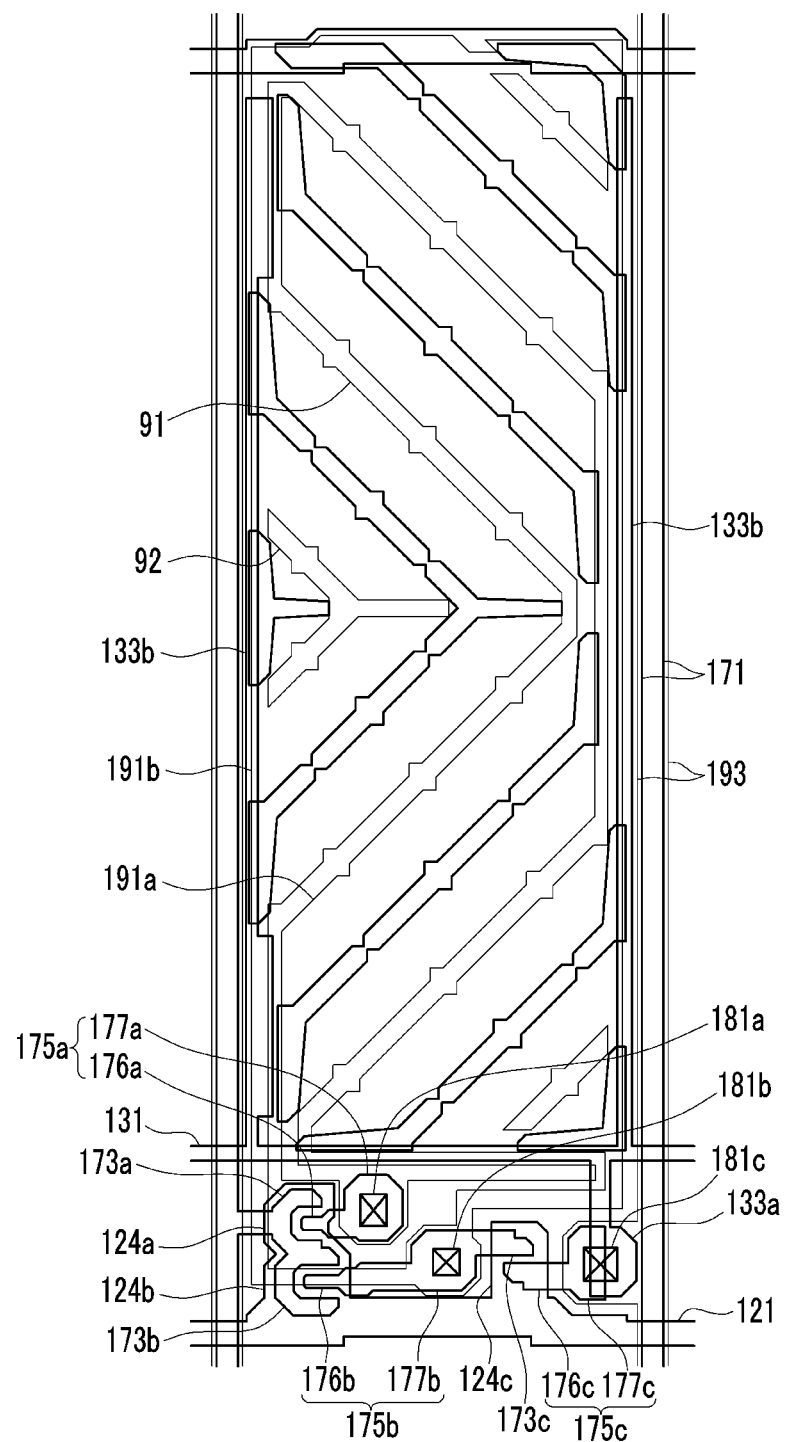
FIG. 7 is a top plan view of an exemplary embodiment of a combined thin film transistor array panel and the opposite panel according to the invention.

FIG. 3 is an equivalent circuit diagram of an exemplary embodiment of a single pixel of a liquid crystal display according to the invention, FIG. 4 is a top plan view of an exemplary embodiment of a thin film transistor array panel of a liquid crystal display according to the invention, and FIG. 5 is a cross-sectional view of the thin film transistor array panel of the liquid crystal display taken along lines V-V' and V'-V" of FIG. 4. FIG. 6 is a top plan view of an exemplary of an opposite display panel of a liquid crystal display according to the invention, and FIG. 7 is a top plan view of an exemplary embodiment of a combined thin film transistor array panel and an opposite display panel according to the invention.

Referring to FIG. 1 and FIG. 3, an exemplary embodiment of the liquid crystal display according to the invention includes a plurality of signal lines Gn, Dn and SL and a plurality of pixels PX connected to the signal lines Gn, Dn and SL.

The signal lines Gn, Dn and SL include a gate line Gn that transmits a gate signal (also referred to as a "scanning signal"), a data line Dn that transmits a data voltage, and a storage electrode line SL to which a constant voltage is applied.

A first thin film transistor T1 and a second thin film transistor T2 are connected to the same gate line Gn and the same data line Dn. Further, a third thin film transistor T3 is connected to the same gate line Gn as the first and second thin film transistors T1 and T2, and is connected to the second thin film transistor T2 and the storage electrode line SL.

Each pixel PX includes two subpixels PXa and PXb. A first liquid crystal capacitor Clca that is connected to the first thin film transistor T1 is in the first subpixel PXa. Further, a second liquid crystal capacitor Clcb that is connected to the second thin film transistor T2 is in the second subpixel PXb.

A first terminal of the first thin film transistor T1 is connected to the gate line Gn, a second terminal thereof is connected to the data line Dn, and a third terminal thereof is connected to the first liquid crystal capacitor Clca. A first terminal of the second thin film transistor T2 is connected to the gate line Gn, a second terminal thereof is connected to the data line Dn, and a third terminal thereof is connected to the second liquid crystal capacitor Clcb. A first terminal of the first thin film transistor T3 is connected to the gate line Gn, a second terminal thereof is connected to the third terminal of the second thin film transistor T2, and a third terminal thereof is connected to the storage electrode line SL.

In the operation of the exemplary embodiment of the liquid crystal display according to the invention, when the gate-on voltage is applied to the gate line Gn, the first to third thin film transistors T1 to T3 connected thereto are turned on, and the first liquid crystal capacitor Clca and the second liquid crystal capacitor Clcb are charged by the data voltage transmitted through the data line Dn.

In this case, since the third thin film transistor T3 is turned on, some of voltage charged in the second liquid crystal capacitor Clcb is leaked through the storage electrode line SL. Accordingly, even though the data voltages that are transmitted to the first subpixel PXa and the second subpixel PXb through the data line Dn are equal to each other, the voltages that are charged in the first liquid crystal capacitor Clca and the second liquid crystal capacitor Clcb are different from each other. That is, the voltage that is charged in the second liquid crystal capacitor Clcb is lower than the voltage that is charged in the first liquid crystal capacitor Clca. By making the voltages that are charged in different subpixels PXa and PXb in the same pixel PX different from each other, side visibility of the liquid crystal display may be improved.

Hereinafter, referring to FIG. 4 and FIG. 5, in the structure of the exemplary embodiment of the thin film transistor array panel of the liquid crystal display according to the invention, a gate line 121 and a storage electrode line 131 are on a first substrate 110 including a transparent glass or plastic. The gate line 121 and the storage electrode line 131 are parallel to each other.

The first gate line 121 has a longitudinal axis that mainly extends in a first (e.g., horizontal in FIG. 4) direction and transmits a gate signal. Further, a first gate electrode 124a and a second gate electrode 124b protrude from the first gate line 121 and are connected to each other. The first gate electrode 124a and the second gate electrode 124b upwardly protrude from the first gate line 121 in the plan view, so that the first gate electrode 124a may be disposed above the second gate electrode 124b. Further, a third gate electrode 124c protrudes in the same direction as the first gate electrode 124a and the second gate electrode 124b from the first gate line 121 and is spaced apart from the second gate electrode 124b in the first direction. The first to third gate electrodes 124a, 124b and 124c are connected to the same gate line 121 and the same gate signal is applied thereto.

The storage electrode line 131 extends in the same direction as the first gate line 121 and a constant voltage such as the common voltage is applied to the storage electrode line 131. A first auxiliary electrode 133a and a second auxiliary electrode 133b protrude from the storage electrode line 131.

The first auxiliary electrode 133a downwardly protrudes from the storage electrode line 131 so as to have a relatively wide planar area. The second auxiliary electrode 133b upwardly protrudes from the storage electrode line 131 and has an elongated relative narrow rod shape. Two second auxiliary electrodes 133b may be adjacent and parallel to right and left edges of a single pixel.

A gate insulating layer 140 is on the gate line 121, the first to third gate electrodes 124a, 124b and 124c, the storage electrode line 131 and the first and second auxiliary electrodes 133a and 133b. The gate insulating layer 140 may include an inorganic insulating material such as silicon nitride (SiNx) or silicon oxide (SiOx). Further, the gate insulating layer 140 may have a single layer or a multilayer structure.

A first semiconductor layer 151a, a second semiconductor layer 151b and a third semiconductor layer 151c are on the gate insulating layer 140. The first semiconductor layer 151a may overlap the first gate electrode 124a, the second semiconductor layer 151b may overlap the second gate electrode 124b, and the third semiconductor layer 151c may overlap the third gate electrode 124c.

A data line 171, a first source electrode 173a, a first drain electrode 175a, a second source electrode 173b, a second drain electrode 175b, a third source electrode 173c and a third drain electrode 175c are on the first to third semiconductor layers 151a, 151b and 151c and the gate insulating layer 140. The second drain electrode 175b and the third source electrode 173c collectively form a single unitary indivisible member, such that the second drain electrode 175b and the third source electrode 173c are connected to each other.

As shown in the drawings, the first to third semiconductor layers 151a, 151b and 151c may be not only above the first to third gate electrodes 124a, 124b and 124c, but may also be below the data line 171. Further, the second semiconductor layer 151b and the third semiconductor layer 151c are connected to each other such as to form a single unitary indivisible member. However, the invention is not limited thereto, and the first to third semiconductor layers 151a, 151b and 151c may be only above the first to third gate electrodes 124a, 124b, and 124c. Further, the second semiconductor layer 151b and the third semiconductor layer 151c may be separated from each other and not continuous with each other.

The data line 171 transmits the data signal and has a longitudinal axis that mainly extends in a second (e.g., vertical in FIG. 4) direction to intersect with the gate line 121.

The first source electrode 173a protrudes from the data line 171 and overlaps the first gate electrode 124a. The first source electrode 173a may be on the first gate electrode 124a so as to have a curved shape such as a 'C' shape in the plan view.

The first drain electrode 175a is on the first gate electrode 124a so as to be spaced apart from the first source electrode 173a. A channel is formed at an exposed portion of the first semiconductor layer 151a that is disposed between the first source electrode 173a and the first drain electrode 175a spaced apart from each other.

The first drain electrode 175a includes a first portion 176a that has a rod shape and overlaps the first gate electrode 124a, and a second portion 177a that is connected to the first portion 176a and has a wider planar area than the first portion 176a. The first portion 176a of the first drain electrode 175a is enclosed or surrounded by the first source electrode 173a.

The second source electrode 173b protrudes from the data line 171 and overlaps the second gate electrode 124b. The second source electrode 173b is on the second gate electrode 124b to have a curved shape as a 'C' shape in the plan view.

The second drain electrode 175b is on the second gate electrode 124b so as to be spaced apart from the second source electrode 173b. A channel is formed at an exposed portion of the second semiconductor layer 151b that is disposed between the second source electrode 173b and the second drain electrode 175b spaced apart from each other.

The second drain electrode 175b includes a first portion 176b that has a rod shape and overlaps the second gate electrode 124b, and a second portion 177b that is connected to the first portion 176b and has a wider planar area than the first portion 176b. The first portion 176b of the second drain electrode 175b is enclosed or surrounded by the second source electrode 173b.

The third source electrode 173c is continuous with and thereby connected to the second drain electrode 175b, particularly to the second portion 177b of the second drain electrode 175b, and overlaps the third gate electrode 124c.

The third drain electrode 175c is on the third gate electrode 124c so as to be spaced apart from the third source electrode 173c. A channel is formed at an exposed portion of the third semiconductor layer 151c that is disposed between the third source electrode 173c and the third drain electrode 175c spaced apart from each other.

The third drain electrode 175c includes a first portion 176c that has a rod shape and overlaps the third gate electrode 124c, and a second portion 177c that is connected to the first portion 176c and has a wider planar area than the first portion 176c.

As shown in the drawings, the third source electrode 173c may be disposed above the third drain electrode 175c, and both the third source electrode 173c and the third drain electrode 175c may overlap the third gate electrode 124c. Alternatively, the third source electrode 173c may be below the third drain electrode 175c, or the third source electrode 173c and the third drain electrode 175c may be disposed to the right and left of a reference line.

The above-described first gate electrode 124a, first semiconductor layer 151a, first source electrode 173a and first drain electrode 175a constitute a first thin film transistor. Further, the second gate electrode 124b, the second semiconductor layer 151b, the second source electrode 173b and the second drain electrode 175b constitute a second thin film transistor, and the third gate electrode 124c, the third semiconductor layer 151c, the third source electrode 173c and the third drain electrode 175c constitute a third thin film transistor. The first to third thin film transistors are disposed along the gate line.

A passivation layer 180 is on the data line 171, the first to third source electrodes 173a, 173b and 173c, and the first to third drain electrodes 175a, 175b, and 175c. The passivation layer 180 may include an organic insulating material or an inorganic insulating material, and may have a single layer or a multilayer structure. The organic insulating material may be a color filter.

The passivation layer 180 includes a first contact hole 181a extended through a thickness thereof to expose a portion of the first drain electrode 175a, and a second contact hole 181b extended through a thickness thereof to expose a portion of the second drain electrode 175b. Particularly, the first contact hole 181a may expose a portion of the second portion 177a of the first drain electrode 175a and the second contact hole 181b may expose a portion of the second portion 177b of the second drain electrode 175b.

Further, the gate insulating layer 140 and the passivation layer 180 include a third contact hole 181c extended through thicknesses thereof to expose a portion of the first auxiliary electrode 133a and the third drain electrode 175c. The third drain electrode 175c overlaps at least a portion of the first auxiliary electrode 133a. Therefore, at least a portion of the gate insulating layer 140 and the passivation layer 180 are removed so that the third contact hole 181c exposes the first auxiliary electrode 133a in a region where the third drain electrode 175c and the first auxiliary electrode 133a do not overlap. Further, at least a portion of the passivation layer 180 is removed so that the third contact hole 181c exposes the third drain electrode 175c in a region where the third drain electrode 175c and the first auxiliary electrode 133a overlap. In other words, a portion of the gate insulating layer 140 remains below an edge of the passivation layer 180 at the region where the third drain electrode 175c and the first auxiliary electrode 133a overlap.

The first subpixel electrode 191a and the second subpixel electrode 191b are on the passivation layer 180.

The first subpixel electrode 191a is connected to the first drain electrode 175a through the first contact hole 181a and the second subpixel electrode 191b is connected to the second drain electrode 175b through the second contact hole 181b. Particularly, the first subpixel electrode 191a may be connected to the second portion 177a of the first drain electrode 175a and the second subpixel electrode 191b may be connected to the second portion 177b of the second drain electrode 175b.

The first subpixel electrode 191a and the second subpixel electrode 191b may have various patterns or shapes. In one exemplary embodiment, for example, as shown in the drawings, the first subpixel electrode 191a and the second subpixel electrode 191b are disposed to have a gap 91 therebetween. In this case, the second subpixel electrode 191b may enclose the first subpixel electrode 191a in a plan view, such that boundaries of the first subpixel electrode 191a are completely within the boundaries of the second subpixel electrode 191b. The first subpixel electrode 191a and the second subpixel electrode 191b may form an angle with respect to the gate line 121 or the data line 171. In this case, the first and second subpixel electrodes 191a and 191b may have a shape that is bent in a first direction in an upper region of one pixel or one subpixel, and bent in a second direction different from the first direction in a lower region of the one pixel or the one subpixel. Further, the first subpixel electrode 191a or the second subpixel electrode 191b may include a cutout 92 parallel to the gap 91.

However, the exemplary embodiment of the first and second subpixel electrodes 191a and 191b is only illustrative and the invention is not limited thereto or thereby. The first and second subpixel electrodes 191a and 191b may have a substantially quadrangle shape, a rod shape which extends substantially parallel to the gate line 121 or the data line 171 or may have various shapes.

Further, a dummy line 193 and a connection electrode 195 may be on the passivation layer 180. The dummy line 193 and the connection electrode 195 may include the same material as the first and second subpixel electrodes 191a and 191b and may be in and of the same layer as the first and second subpixel electrodes 191a and 191b.

The dummy line 193 has a longitudinal axis which may be parallel to the data line 171 and particularly may overlap the data line 171. As shown in the drawings, the dummy line 193 may be wider than the data line 171 in a direction perpendicular to the longitudinal axis. Alternatively, the dummy line 193 may be narrower than the data line 171 in the direction perpendicular to the longitudinal axis.

The connection electrode 195 protrudes from and is continuous with the dummy line 193, and is on and overlapping the first auxiliary electrode 133a and the third drain electrode 175c. The connection electrode 195 covers the first auxiliary electrode 133a and the third drain electrode 175c exposed by the third contact hole 181c. Accordingly, the connection electrode 195 is connected to the first auxiliary electrode 133a and the third drain electrode 175c through the third contact hole 181c.

The dummy line 193 is connected to the connection electrode 195, the connection electrode 195 is connected to the first auxiliary electrode 133a, and the first auxiliary electrode 133a is connected to the storage electrode line 131 so that a constant voltage applied to the storage electrode line 131 is applied to the dummy line 193. Accordingly, the dummy line 193 connects a plurality of storage electrode lines 131 extended in the first (e.g., horizontal) direction and substantially parallel to each other to lower the resistivity thereof.

Next, referring to FIG. 6, in an exemplary embodiment of a structure of the opposite display panel of the liquid crystal display according to the invention, a light blocking member 220 is on a second substrate (not shown) including a transparent glass or plastic, so as to correspond to an interface of (e.g., boundary between) adjacent pixels, and a common electrode 270 is on the entire surface of the second substrate.

The light blocking member 220 may be in a position corresponding to the gate line 121, the data line 171 and the first to third thin film transistors included in the thin film transistor array panel. Differently from the drawings in an alternative embodiment, the light blocking member 220 may be on the first substrate 110, and not on the second substrate. Particularly, when the color filter is on the first substrate 110, the light blocking member 220 may be on the color filter. In this case, the light blocking member 220 may be in a position corresponding to the gate line 121, the data line 171 and the first to third thin film transistors of the thin film transistor array panel.

The common electrode 270 may include a cutout 71 in one pixel or in one subpixel. The cutout 71 may be plural in the one pixel or the one subpixel, and the number of the cutouts 71 and the position thereof may be variously modified. The position of the cutout 71 will be described below with reference to FIG. 7.

Referring to FIG. 7, in the exemplary embodiment of the combined thin film transistor array panel and the opposite display panel structure of the liquid crystal display according to the invention, the above-described thin film transistor array panel and opposite display panel are bonded. For convenience, in FIG. 7, the light blocking member is omitted.

The cutout 71 of the common electrode 270 is disposed between the gap 91 and the cutout 92 of the first and second subpixel electrodes 191a and 191b of the thin film transistor array panel to extend substantially parallel to the gap 91 and the cutout 92.

A plurality of domains are formed in one pixel by the gap 91 and the cutout 92 of the first and second subpixel electrodes 191a and 191b and the cutout 71 of the common electrode 270. By doing this, a reference viewing angle of the liquid crystal display may be increased. In an alternative exemplary embodiment, at least one of the cutout 92 of the first and second subpixel electrodes 191a and 191b and the cutout 71 of the common electrode 270 may be substituted by a protrusion or a dent.

In the above description, the light blocking member 220 and the common electrode 270 are on the opposite display panel. However, the invention is not limited thereto, and the light blocking member 220 and the common electrode 270 may be included in the thin film transistor array panel.

Next, exemplary embodiments of an arrangement of a plurality of pixels in a liquid crystal display according to the invention will be described.

Figure 8:
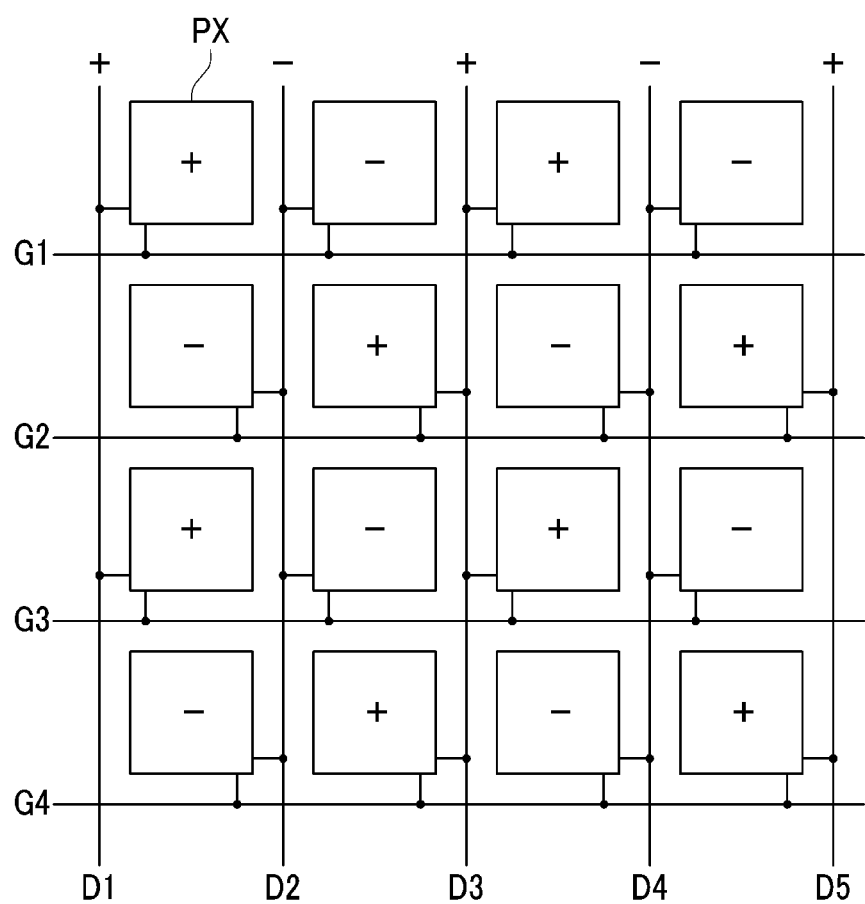
FIGS. 8 and 9 are a diagram illustrating exemplary embodiments of arrangements of a plurality of gate lines, a plurality of data lines and a plurality of pixels in a liquid crystal display according to the invention in brief.
Figure 9:
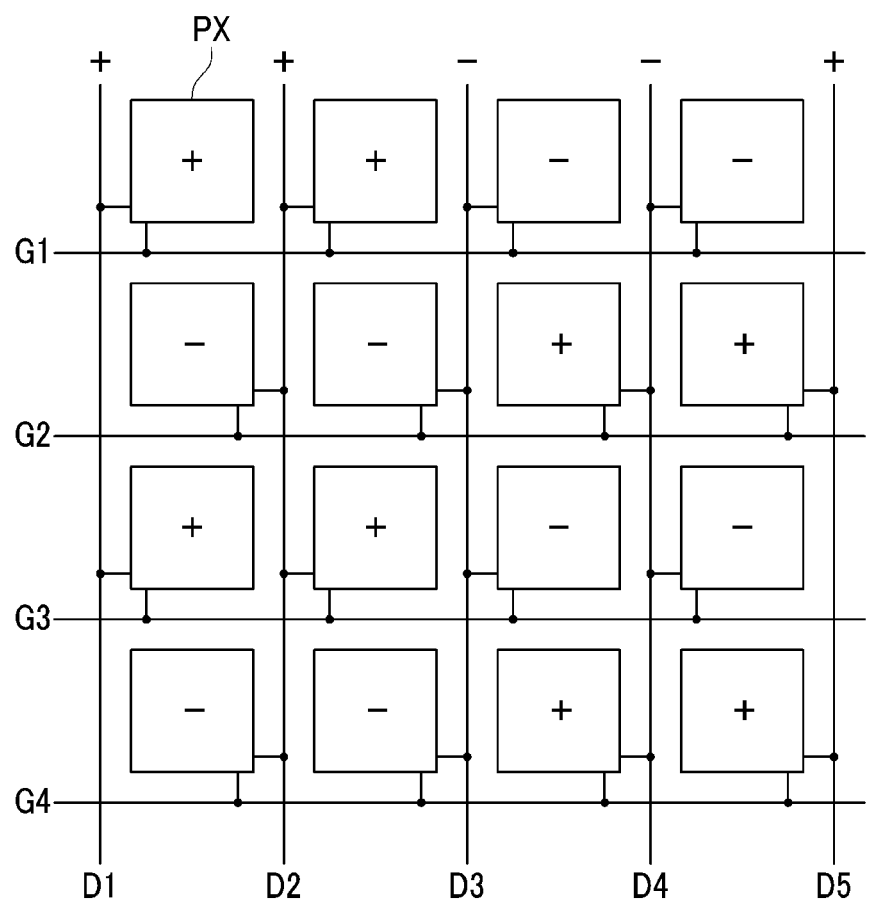

FIG. 8 and FIG. 9 are diagrams illustrating exemplary embodiments of a plurality of gate lines, data lines and pixels in the liquid crystal display according to an the invention in brief.

First to fourth gate lines G1 to G4 and first to fifth data lines D1 to D5 are intersect with each other, and pixels PX are connected to the gate lines G1 to G4 and the data lines D1 to D5.

In FIG. 8, a positive data signal is applied to odd numbered data lines D1, D3, and D5 and a negative data signal is applied to even numbered data lines D2 and D4. In other words, the data signal is applied in a column inversion manner.

In FIG. 9, a positive data signal is applied to the first, second, and fifth data lines D1, D2 and D5, and a negative data signal is applied to the third and fourth data lines D3 and D4. That is, two data lines form a group and a data signal is applied to the group in a column inversion manner.

In this case, individual pixels PX connected to the same data lines D1 to D5 may be arranged in a zigzag pattern so as to have a dot inversion effect or a double dot inversion effect with reduced power consumption. In other words, the pixels PX connected to the data lines D1 to D5 are alternatively arranged right and left of a same data line in the column direction. By doing this, thin film transistors (not shown) that connect the gate lines G1 to G4 and the data lines D1 to D5 to the pixels PX are alternatively arranged at right and left sides of the data lines D1 to D5. Accordingly, FIG. 4 and FIG. 7 show a structure of one pixel in which another pixel disposed in a next row may be symmetrical to the structure of the pixel shown in FIG. 4 and FIG. 7.

Figure 10:
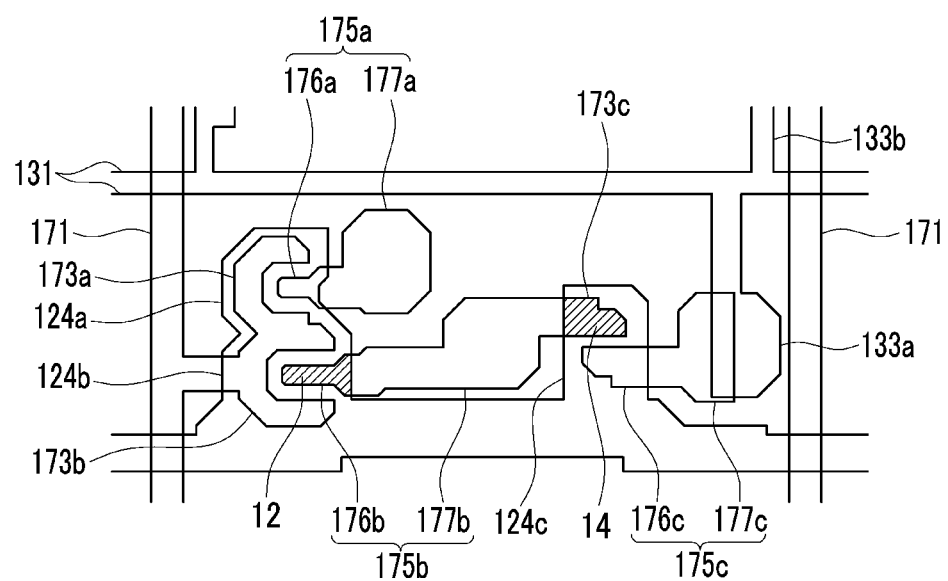
FIG. 10 is a top plan view of an exemplary embodiment of first to third thin film transistors in odd numbered rows together with gate lines, data lines and storage electrode lines in a liquid crystal display according to the invention.
Figure 11:
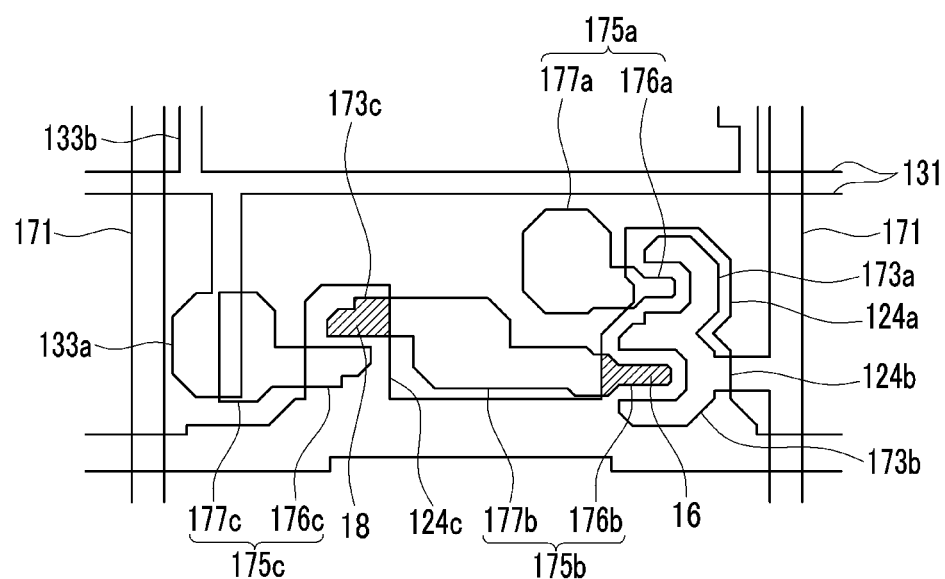
FIG. 11 is a top plan view of an exemplary embodiment of first to third thin film transistors in even numbered rows together with gate lines, data lines, and storage electrode lines in a liquid crystal display according to the invention.

Referring to FIG. 10 and FIG. 11, thin film transistors disposed in odd numbered rows and thin film transistors disposed in even numbered rows may be symmetrical to each other.

FIG. 10 is a top plan view of an exemplary embodiment of first to third thin film transistors disposed in odd numbered rows together with gate lines, data lines and storage electrode lines in a liquid crystal display according to the invention and FIG. 11 is a top plan view of an exemplary embodiment of first to third thin film transistors disposed in even numbered rows together with gate lines, data lines and storage electrode lines in a liquid crystal display according to the invention.

Referring to FIG. 10, in the first to third thin film transistors disposed in the odd numbered rows, the first and second gate electrodes 124a and 124b are disposed so as to be close to the data line 171 adjacent to the left side of the corresponding pixel, and the first and second source electrodes 173a and 173b protrude toward the right side from the data line 171 adjacent to the left side of the corresponding pixel. Further, the third gate electrode 124c is disposed so as to be close to the data line 171 adjacent to the right side of the corresponding pixel and the first auxiliary electrode 133a is disposed between the third gate electrode 124c and the data line 171 adjacent to the right side of the corresponding pixel.

Referring to FIG. 11, the first to third thin film transistors disposed in the even numbered rows and the first to third thin film transistors disposed in the odd numbered rows are symmetrical to each other with respect to the data line 171 from which protrude the first and second source electrodes 173a and 173b. Specifically, the first and second gate electrodes 124a and 124b are disposed so as to be close to the data line 171 adjacent to the right side of the corresponding pixel, and the first and second source electrodes 173a and 173b protrude toward the left side from the data line 171 adjacent to the right side of the corresponding pixel. Further, the third gate electrode 124c is disposed so as to be close to the data line 171 adjacent to the left side of the corresponding pixel and the first auxiliary electrode 133a is disposed between the third gate electrode 124c and the data line 171 adjacent to the left side of the corresponding pixel.

Hereinafter, referring to FIG. 10 and FIG. 11, a characteristic of one or more exemplary embodiments of the liquid crystal display according to the invention, in which a parasitic capacitance formed by overlapping the gate electrode and the source/drain electrode is constantly maintained in spite of misalignment of a mask used in forming the liquid crystal display, is described.

FIG. 10 shows a part of FIG. 1 and FIG. 4 described above in which in the odd numbered rows, the first and second gate electrodes 124a and 124b protrude upwardly from the gate line 121, and the third gate electrode 124c protrudes in a same direction as the first and second gate electrodes 124a and 124b and is spaced apart from the second gate electrode 124b. In this case, the first and second gate electrodes 124a and 124b are adjacent to the data line 171 disposed at the left side of the corresponding pixel and the third gate electrode 124c is adjacent to the data line 171 disposed at the right side of the corresponding pixel.

The drain electrode 175b of the second thin film transistor and the source electrode 173c of the third thin film transistor are connected to each other between the second gate electrode 124b and the third gate electrode 124c that are spaced apart from each other.

A portion of the second thin film transistor of an odd numbered row where the second gate electrode 124b and the second drain electrode 175b overlap is referred to as a first overlapping part 12, and a portion of the third thin film transistor of an odd numbered row where the third gate electrode 124c and the third source electrode 173c overlap is referred to as a second overlapping part 14.

Due to the misalignment of a mask used in the forming of the liquid crystal display, areas of the first overlapping part 12 and the second overlapping part 14 may be varied. In one exemplary embodiment, for example, the data line 171 from which protrude the first and second source electrodes 173a and 173b may move further to the right compared to the position shown in FIG. 10. Therefore, the second drain electrode 175b and the third source electrode 173c which are formed by the same mask as the data line 171 are moved further to the right compared to the position currently shown in FIG. 10. By the position movement of the second drain electrode 175b and the third source electrode 173c, the area of the first overlapping part 12 is reduced and the area of the second overlapping part 14 is increased. However, the sum of the areas of the first overlapping part 12 and the second overlapping part 14 is constantly maintained, so that the value of the parasitic capacitance that influences the second subpixel connected to the second thin film transistor is not affected.

In contrast, the data line 171 from which protrude the first and second source electrodes 173a and 173b may move further to the left compared to the position shown in FIG. 10. In this case, even by the position movement of the second drain electrode 175b and the third source electrode 173c further to the left, the sum of the areas of the first overlapping part 12 and the second overlapping part 14 is still constantly maintained.

FIG. 11 shows an even numbered row having a symmetrical shape to FIG. 10 with respect to the data line from which protrude the first and second source electrodes 173a and 173b. Also in the even numbered row, first and second gate electrodes 124a and 124b protrude upwardly from the gate line 121, and a third gate electrode 124c protrudes in the same direction as the first and second gate electrodes 124a and 124b and is spaced apart from the second gate electrode 124b. In this case, the first and second gate electrode 124a and 124b are adjacent to the data line 171 disposed at the right side of the corresponding pixel and the third gate electrode 124c is adjacent to the data line 171 disposed at the left side of the corresponding pixel.

The drain electrode 175b of the second thin film transistor and the source electrode 173c of the third thin film transistor are connected to each other between the second gate electrode 124b and the third gate electrode 124c which are spaced apart from each other.

A portion of the second thin film transistor of the even numbered row where the second gate electrode 124b and the second drain electrode 175b overlap is referred to as a third overlapping part 16, and a portion of the third thin film transistor of the even numbered row where the third gate electrode 124c and the third source electrode 173c overlap is referred to as a fourth overlapping part 18.

Due to the misalignment of the mask used in the forming of the liquid crystal display, areas of the third overlapping part 16 and the fourth overlapping part 18 may be varied. In one exemplary embodiment, for example, the data line 171 from which protrude the first and second source electrodes 173a and 173b may move further to the right compared to the position currently shown in FIG. 11. Therefore, the second drain electrode 175b and the third source electrode 173c which are formed by the same mask as the data line 171 move further to the right compared to the position currently shown in FIG. 11. By the position movement of the second drain electrode 175b and the third source electrode 173c, the area of the third overlapping part 16 is increased and the area of the fourth overlapping part 18 is reduced. However, the sum of the areas of the third overlapping part 16 and the fourth overlapping part 18 is constantly maintained, so that the value of the parasitic capacitance that influences the second subpixel connected to the second thin film transistor is not affected.

In contrast, the data line 171 from which protrude the first and second source electrodes 173a and 173b may move further to the left compared to the position currently shown in FIG. 11. In this case, even by the position movement of the second drain electrode 175b and the third source electrode 173c further to the left, the sum of the areas of the third overlapping part 16 and the fourth overlapping part 18 is still constantly maintained.

Assuming a structure of the liquid crystal display which does not include a third thin film transistor, the structure is compared with an exemplary embodiment of a liquid crystal display according to the invention below. If the third thin film transistor is omitted, when the data line from which protrude the first and second source electrodes 173a and 173b of first and second thin film transistor moves toward the right due to the misalignment of the mask used in forming the liquid crystal display, the overlapping area between the gate electrode and the source/drain electrode of the second thin film transistor in the odd numbered row is reduced and the overlapping area between the gate electrode and the source/drain electrode in the second thin film transistor in the even numbered row is increased. Therefore, a parasitic capacitance formed by overlapping the gate electrode and the source/drain electrode is not maintained and this phenomenon is viewed as a horizontal striped pattern.

In contrast, in one or more exemplary embodiment of the invention described above, the overlapping area between the gate electrode and the source/drain electrode is constantly maintained, which maintains the parasitic capacitance formed by overlapping the gate electrode and the source/drain electrode and prevents the horizontal stripped pattern from occurring.

In the above description, the thin film transistors are in a zigzag arrangement alternating at right and left sides of the data line. However, the invention is not limited thereto, and the thin film transistors may be at one side of the data line.

Next, referring to FIG. 12 and FIG. 13, another exemplary embodiment of a liquid crystal display according to the invention will be described below.

The exemplary embodiment of the liquid crystal display in FIG. 12 and FIG. 13 has substantially similar parts as the above-described exemplary embodiment, so that the description of the same parts will be omitted but the different parts will be described. The significant difference from the above-described exemplary embodiment is that the liquid crystal display further includes an extension electrode that extends from the third gate electrode and the first drain electrode on the extension electrode, which will be described in detail.

Figure 12:
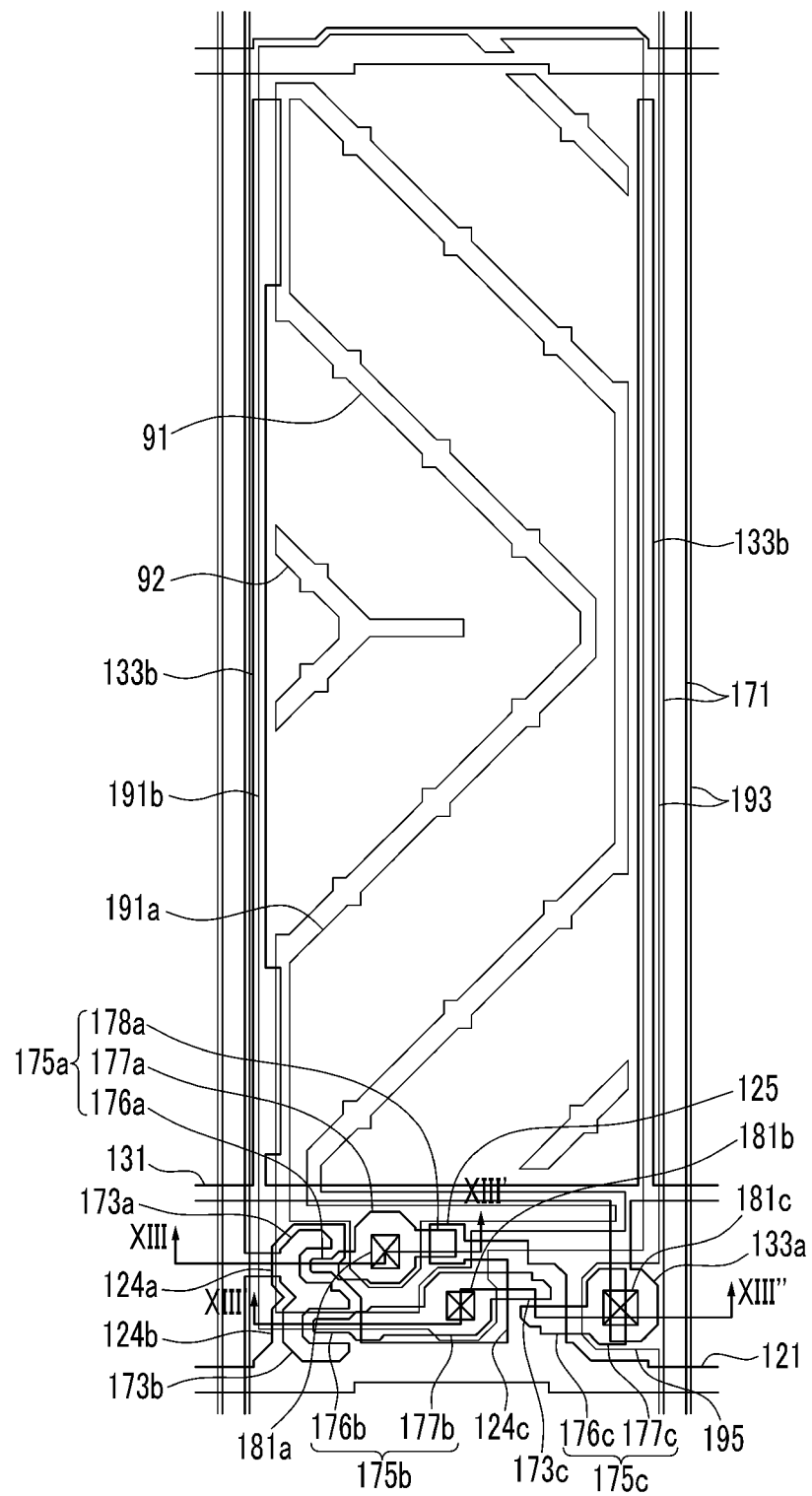
FIG. 12 is a top plan view of another exemplary embodiment of a thin film transistor array panel of a liquid crystal display according to the invention.
Figure 13:
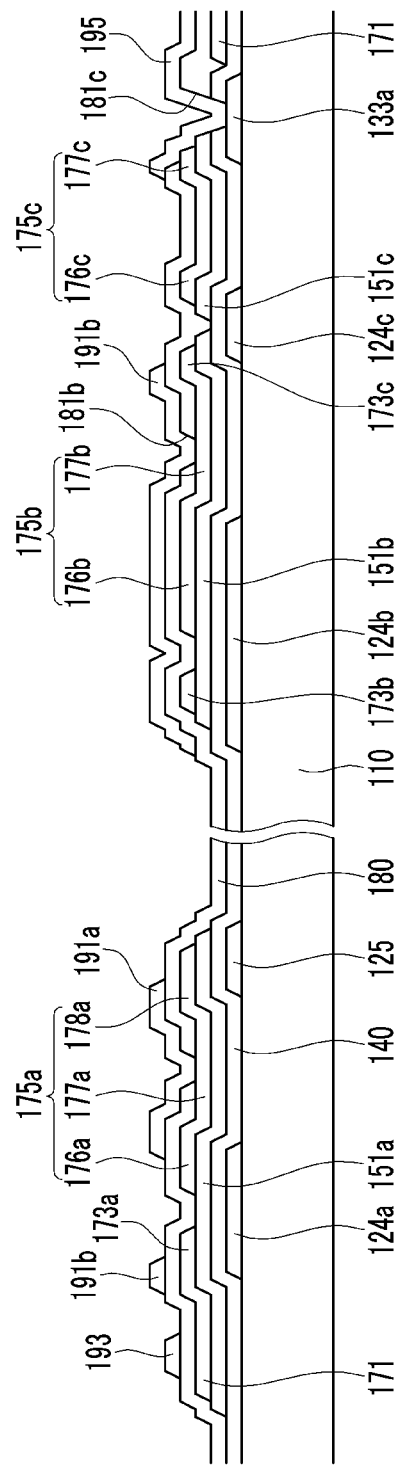
FIG. 13 is a cross-sectional view of the thin film transistor array panel of the liquid crystal display taken along lines XIII-XIII' and XIII'-XIII'' of FIG. 12.

FIG. 12 is a top plan view of an exemplary embodiment of a thin film transistor array panel of a liquid crystal display according to the invention, and FIG. 13 is a cross-sectional view of the thin film transistor array panel of the liquid crystal display taken along lines XIII-XIII' and XIII'-XIII" of FIG. 12.

The schematic structure of the liquid crystal display in FIG. 12 and FIG. 13 is the same as that of the liquid crystal display shown in FIG. 1 to FIG. 3.

In the exemplary embodiment of the liquid crystal display according to the invention, as shown in FIG. 12 and FIG. 13, a gate line 121 and a storage electrode line 131 are on the first substrate 110.

The first and second gate electrodes 124a and 124b protrude from the gate line 121 and a third gate electrode 124c protrudes in the same direction as the first and second gate electrodes 124a and 124b and is spaced apart from the second gate electrode 124b.

Further, an extension electrode 125 extends from the third gate electrode 124c so as to be spaced apart from the first gate electrode 124a. As shown in the drawings, the extension electrode 125 extends upwardly from the third gate electrode 124c in the plan view and then extends again after being curved toward the left side of the pixel, such as toward the data line 171 from which protrude the first and second source electrodes 173a and 173b. However, the shape of the extension electrode 125 is not limited thereto, but variously modified. In one or more exemplary embodiments, the extension electrode 125 is spaced apart from the first gate electrode 124a and faces the first gate electrode 124a.

First and second auxiliary electrodes 133a and 133b protrude from the storage electrode line 131.

A gate insulating layer 140 is on the gate line 121, the storage electrode line 131, the first to third gate electrodes 124a, 124b and 124c, the extension electrode 125, and the first and second auxiliary electrodes 133a and 133b.

First to third semiconductor layers 151a, 151b and 151c are on the gate insulating layer 140, and a data line 171, a first source electrode 173a, a first drain electrode 175a, a second source electrode 173b, a second drain electrode 175b, a third source electrode 173c and a third drain electrode 175c are on the first to third semiconductor layers 151a, 151b and 151c and the gate insulating layer 140. The second drain electrode 175b and the third source electrode 173c collectively form a single unitary indivisible member, such that the second drain electrode 175b and the third source electrode 173c are connected to each other.

The first drain electrode 175a includes a first portion 176a that has a rod shape and is overlaps the first gate electrode 124a, a second portion 177a that is connected to the first portion 176a and has a wider planar area than the first portion 176a, and a third portion 178a that is connected to the second portion 177a and has a rod shape. The first to third portions 177a, 176a and 178a collectively form a single unitary indivisible member, such that the third portion 178a and the second portion 177a are connected to each other.

The first portion 176a is enclosed or surrounded by the first source electrode 173a that is curved as a 'C' shape. The first drain electrode 175a has a longitudinal axis extending in the first (e.g., horizontal) direction. The second portion 177a is located between the first gate electrode 124a and the extension electrode 125. The third portion 178a has a planar width perpendicular to the first direction which is smaller than the second portion 177a and overlaps the extension electrode 125. The first to third thin film transistors are disposed along the gate line.

A passivation layer 180 is on the data line 171, the first to third source electrodes 173a, 173b and 173c, and the first to third drain electrodes 175a, 175b and 175c, and includes the first and second contact holes 181a and 181b extended through a thickness thereof. Further, the gate insulating layer 140 and the passivation layer 180 include a third contract hole 181c extended through thicknesses thereof.

The first and second subpixel electrodes 191a and 191b, a dummy line 193 and a connection electrode 195 are on the passivation layer 180.

In the exemplary embodiment of FIG. 12 and FIG. 13, an extension electrode 125 continuously extends from the third gate electrode 124c and a first drain electrode 175a reaches and overlaps a distal portion of the extension electrode 125 so that the parasitic capacitance formed in the first thin film transistor is constantly maintained in spite of the misalignment of a mask used in forming the liquid crystal display.

Referring to FIG. 12 and FIG. 13, for example, when the data line 171 from which protrude the first and second source electrodes 173a and 173b moves further to the right compared to the position currently shown in FIG. 12 and FIG. 13 due to the misalignment of the mask used in forming the liquid crystal display, the second drain electrode 175b and the third source electrode 173c which are formed by the same mask as the data line 171 are also moved further to the right and the overlapping area of the first gate electrode 124a and the first drain electrode 175a is reduced. By the position movement of the second drain electrode 175b and the third source electrode 173c, the overlapping area of the first drain electrode 175a and the extension electrode 125 is increased and the increased amount is equal to an amount of reduced overlapping area of the first gate electrode 124a and the first drain electrode 175a. Therefore, the area in which the first drain electrode 175a overlap the first gate electrode 124a and the extension electrode 125 is constantly maintained and the value of the parasitic capacitance that influences the first subpixel connected to the first thin film transistor is not affected.

Next, referring to FIG. 14 and FIG. 15, yet another exemplary embodiment a liquid crystal display according to the invention will be described.

The exemplary embodiment of the liquid crystal display in FIG. 14 and FIG. 15 has substantially similar parts as the above-described exemplary embodiment, so that the description of the same parts will be omitted but the different parts will be described. The significant different from the above-described exemplary embodiment is that the liquid crystal display does not include dummy line, which will be described in detail.

Figure 14:
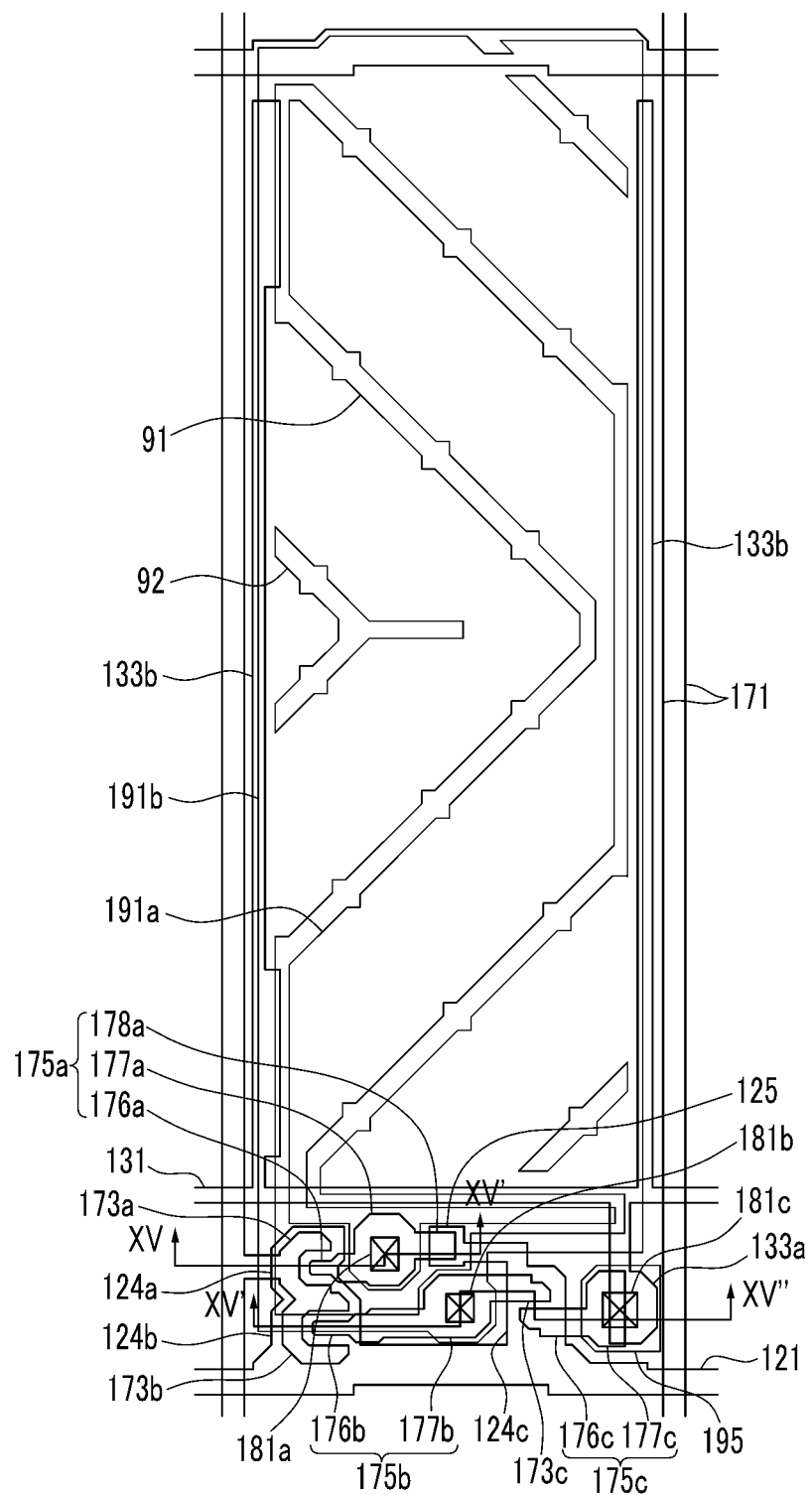
FIG. 14 is a top plan view of yet another exemplary embodiment of a thin film transistor array panel of a liquid crystal display according to the invention.
Figure 15:
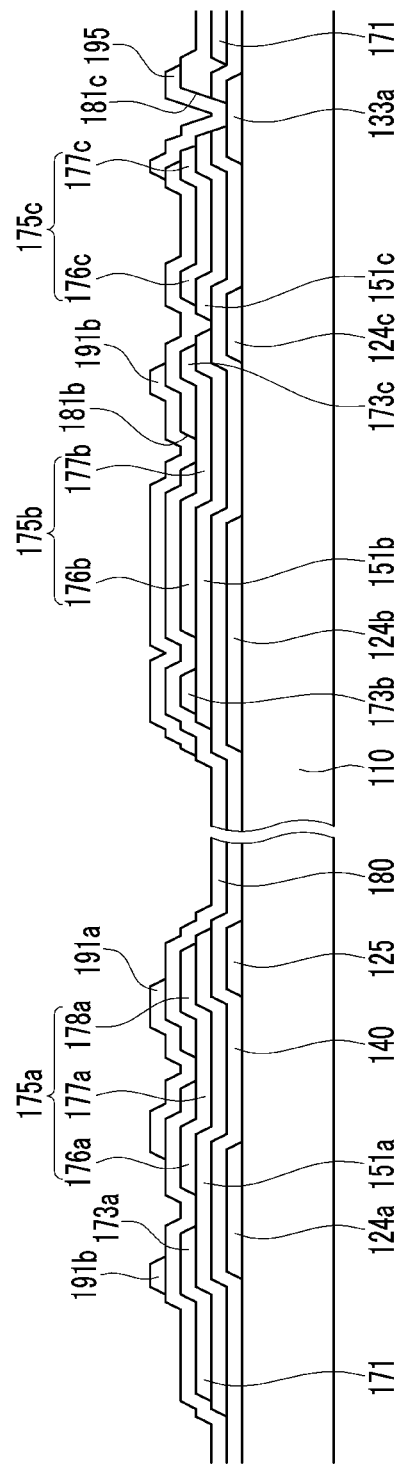
FIG. 15 is a cross-sectional view of the thin film transistor array panel of the liquid crystal display taken along lines XV-XV' and XV'-XV'' of FIG. 14.

FIG. 14 is a top plan view of yet another exemplary embodiment of a thin film transistor array panel of a liquid crystal display according to the invention and FIG. 15 is a cross-sectional view of the thin film transistor array panel of the liquid crystal display taken along lines XV-XV' and XV'-XV" of FIG. 14.

The schematic structure of the liquid crystal display in FIG. 14 and FIG. 15 is the same as the structure of the liquid crystal display shown in FIG. 1 to FIG. 3.

The exemplary embodiment of the liquid crystal display according to the invention, as shown in FIG. 14 and FIG. 15, includes a gate line 121, a storage electrode line 131, and a data line 171 on a first substrate 110, and first to third thin film transistors connected to the gate line 121 and the data line 171. The first to third thin film transistors are disposed along the gate line.

A connection electrode 195 is on a passivation layer 180 to connect a first auxiliary electrode 133a and a third drain electrode 175c to each other. Differently from the above-described exemplary embodiment, the dummy line is not connected to the connection electrode 195. That is, the dummy line does not overlap the data line 171. In this case, even though not shown in the drawings, a connection pattern may be further formed so as to connect the storage electrode lines 131 formed in different rows.

In the exemplary embodiment in FIG. 14 and FIG. 15, a structure that the dummy line is omitted from the thin film transistor of the exemplary embodiment of the liquid crystal display shown in FIG. 12 and FIG. 13 is described. However, the invention is not limited thereto, but also includes a structure that the dummy line is omitted from the thin film transistor of the liquid crystal display shown in FIG. 4 and FIG. 5.

One or more of the exemplary embodiments of the liquid crystal display according to the invention may be variously modified. Hereinafter, referring to FIG. 16 and FIG. 17, modifications of the liquid crystal display of previous exemplary embodiments will be described.

Figure 16:
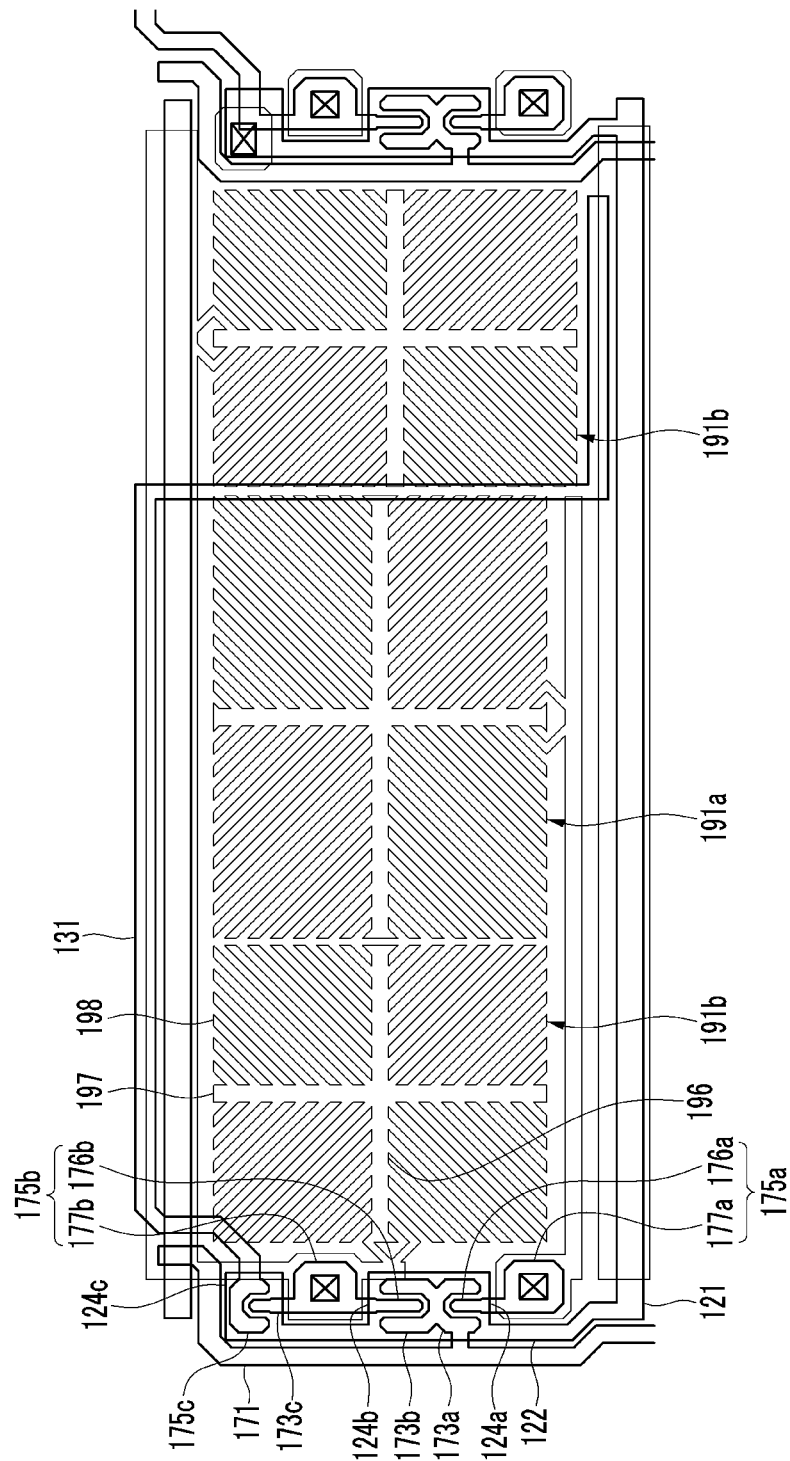
FIG. 16 is a top plan view of a modified exemplary embodiment of a thin film transistor array panel of a liquid crystal display according to the invention.
Figure 17:
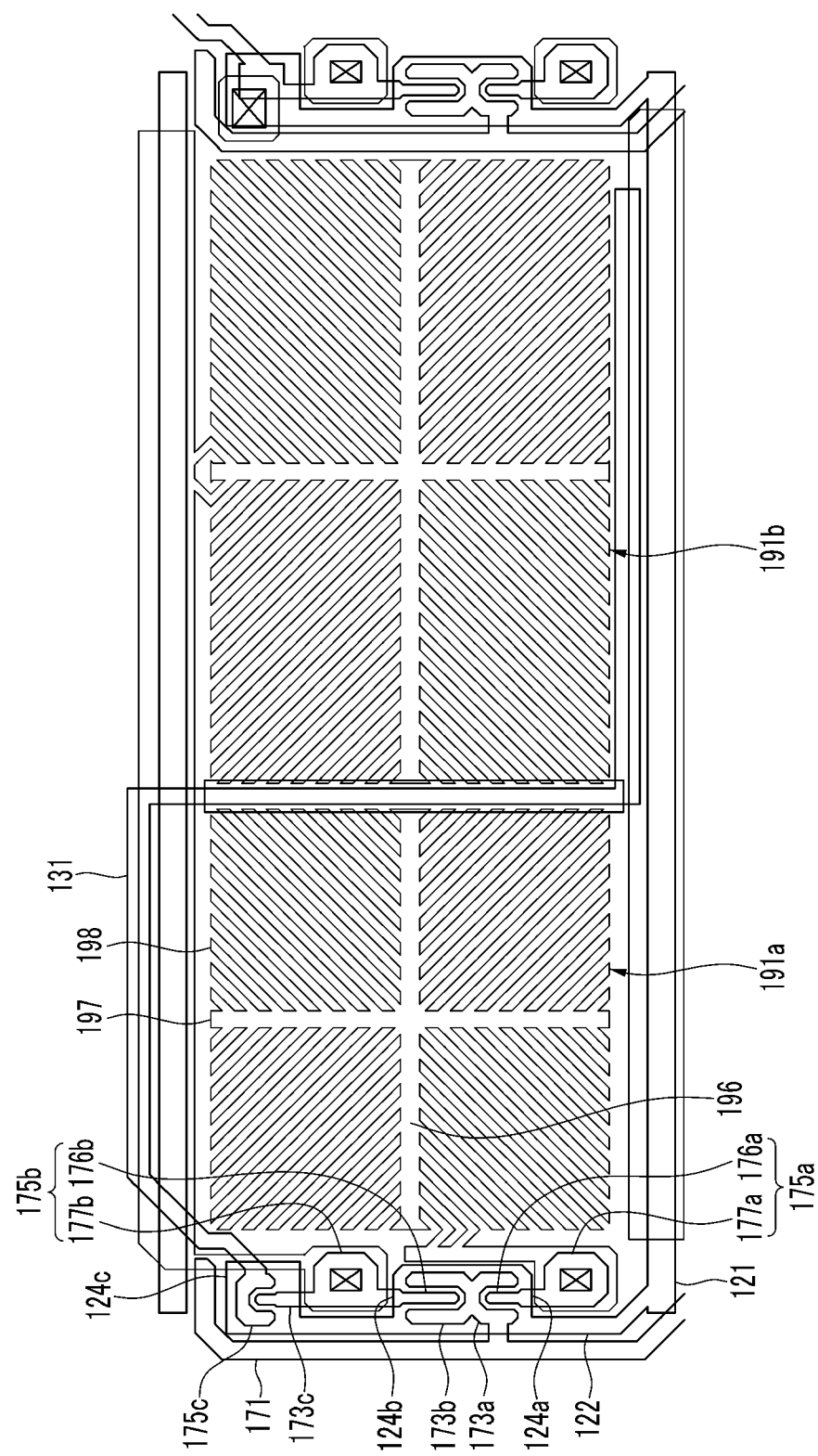
FIG. 17 is a top plan view of another modified exemplary embodiment of a thin film transistor array panel of a liquid crystal display according to the invention.

FIG. 16 is a top plan view of a modified exemplary embodiment of a thin film transistor array panel of a liquid crystal display according to the invention and FIG. 17 is a top plan view of another modified exemplary embodiment of a thin film transistor array panel of a liquid crystal display according to the invention.

A modified exemplary embodiment of a liquid crystal display according to the invention, as shown in FIG. 16, includes a gate line 121 extending in one direction on a first substrate (now shown) and a data line 171 intersecting with the gate line 121.

The gate line 121 extends substantially in a first (e.g., horizontal) direction in the plan view and an auxiliary gate line 122 protrudes from the gate line 121 at one edge of the pixel so as to extend in a direction parallel to the data line 171.

Further, first and second gate electrodes 124a and 124b protrude from the auxiliary gate line 122 to be connected to each. The first and second gate electrodes 124a and 124b protrude to the right side from the auxiliary gate line 122 and the second gate electrode 124b may be disposed above the first gate electrode 124a.

Further, a third gate electrode 124c protrudes from the auxiliary gate line 122 in the same direction as the first and second gate electrodes 124a and 124b and is spaced apart from the first and second gate electrodes 124a and 124b in a second (e.g., vertical) direction in the plan view.

The data line 171 has a longitudinal axis that extends substantially in the vertical direction, and a first source electrode 173a and a second source electrode 173b protrude from the data line 171 and overlap the first and second gate electrodes 124a and 124b. The first and second source electrodes 173a and 173b may have a curved shape in the plan view.

A first drain electrode 175a is on the first gate electrode 124a so as to be spaced apart from the first source electrode 173a, and a second drain electrode 175b is on the second gate electrode 124b so as to be spaced apart from the second source electrode 173b.

The second drain electrode 175b has a first portion 176b that has a rod shape and is on the second gate electrode 124a, and a second portion 177b that is connected to the first portion 176b and has a wider planar area than the first portion 176b.

A third source electrode 173c is on the third gate electrode 124c and continuous with the second drain electrode 175b so as to be connected to the second drain electrode 175b. A third drain electrode 175c is spaced apart from the third source electrode 173c. In this case, the third source electrode 173c is connected to the second portion 177b of the second drain electrode 175b and has a rod shape. The third drain electrode 175c may be curved so as to enclose or surround the third source electrode 173c.

Referring to the exemplary embodiment of FIG. 16, a pixel may include three subpixels disposed at right, left and center of the pixel. A first subpixel electrode 191a that is connected to the first drain electrode 175a may be in the subpixel disposed at the center of the pixel, and a second subpixel electrode 191b that is connected to the second drain electrode 175b may be in the subpixels disposed at the right and left of the pixel.

The first and second subpixel electrodes 191a and 191b include a horizontal branch 196 that has an elongated relatively narrow rod shape in a direction parallel to the gate line 121, and a vertical branch 197 that has an elongated relatively narrow rod shape in a direction parallel to the data line 171. Further, first and second subpixel electrodes 191a and 191b include a minute branch 198 that extends from the horizontal branch 196 and/or the vertical branch 197. One subpixel is divided into four regions by the horizontal branch 196 and the vertical branch 197, and the minute branches 198 in the four regions extend in different directions.

A storage electrode line 131 may be in a region between two subpixels adjacent to each other in the vertical direction. Referring to the exemplary embodiment in FIG. 16, for example, as shown in the drawings, the storage electrode line 131 may be at upper edges of the two subpixels disposed at the left and center, at a lower edge of the subpixel disposed at the right, and between the subpixel disposed at the center and the subpixel disposed at the right, in the plan view. In this case, the storage electrode line 131 may include the same material as the data line 171 and may be in the same layer as the data line 171.

A constant voltage such as a common voltage may be applied to the storage electrode line 131 and the storage electrode line may be connected to the third drain electrode 175c. That is, the third drain electrode 175c and the storage electrode line 131 may form a single, unitary, indivisible member.

In the modified exemplary embodiment of the invention, if the overlapping area of the second gate electrode 124b and the second drain electrode 175b is reduced due to the misalignment of the mask, the overlapping area of the third gate electrode 124c and the third source electrode 173c is correspondingly increased. Therefore, the value of the parasitic capacitance that influences the subpixel connected to the second thin film transistor including the second gate electrode 124b, the second source electrode 173b and the second drain electrode 175b is not affected.

In the above-described exemplary embodiments, the first to third thin film transistors are disposed along the gate line direction. In contrast, in the modified exemplary embodiment of the invention, the first to third thin film transistors are disposed along the data line. Further, a side of the pixel that is parallel to the gate line is longer than a side of the pixel that is parallel to the data line, and the pixel is divided into three subpixels.

In another modified exemplary embodiment of a liquid crystal display according to the invention, as shown in FIG. 17, the first to third thin film transistors is similar to those in FIG. 16. Further, the liquid crystal display in FIG. 17 is similar to that shown in FIG. 16 in that a side of the pixel that is parallel to the gate line is longer than a side of the pixel that is parallel to the data line.

In the modified exemplary embodiment in FIG. 17 of the invention, one pixel includes two subpixels disposed at the right and left sides of the one pixel. A first subpixel electrode 191a that is connected to a first drain electrode 175a may be in the subpixel disposed at the left side of the one pixel and a second subpixel electrode 191b that is connected to a second drain electrode 175b may be in the subpixel disposed at the right side of the one pixel.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A thin film transistor array panel, comprising:
a first substrate;
a gate line lengthwise extended in a first direction and a data line lengthwise extended in a second direction intersecting with the first direction, on the first substrate;
a storage electrode line on the first substrate, wherein a constant voltage is applied thereto;
a first thin film transistor which is connected to the gate line and the data line, and comprises a first gate electrode, a first source electrode and a first drain electrode;
a second thin film transistor which is connected to the gate line and the data line, and comprises a second gate electrode, a second source electrode and a second drain electrode;
a third thin film transistor which is connected to the gate line, the second thin film transistor and the storage electrode line, and comprises a third gate electrode, a third source electrode and a third drain electrode;
a first subpixel electrode which is connected to the first thin film transistor; and
a second subpixel electrode which is connected to the second thin film transistor,
wherein
the first, second and third gate electrodes are defined extended in the second direction from a same gate line to overlap the first, second and third drain electrodes, respectively,
the second and third thin film transistors are spaced apart from each other in the first direction in which the gate line is lengthwise extended,
the third source electrode of the third thin film transistor is directly connected to the second drain electrode of the second thin film transistor, and
the second drain electrode and third source electrode directly connected to each other define lengthwise extensions thereof in the first direction in which the second and third thin film transistors are spaced apart from each other, the lengthwise extension in the first direction overlapping the second gate electrode of the second thin film transistor and the third gate electrode of the third thin film transistor which is spaced apart from the second thin film transistor in the first direction, respectively.

2. The thin film transistor array panel of claim 1, wherein:
the third gate electrode defines an extension electrode thereof which extends to overlap the first drain electrode.

3. The thin film transistor array panel of claim 2, wherein the first and third thin film transistors are spaced apart from each other in the first direction in which the gate line is lengthwise extended, and
the extension electrode defines a lengthwise extension thereof in the first direction in which the first and third thin film transistors are spaced apart from each other, the extension of the third gate electrode overlapping the first drain electrode of the first thin film transistor which is spaced apart from the third thin film transistor.

4. The thin film transistor array panel of claim 3, wherein the extension electrode is spaced apart from the first gate electrode.

5. The thin film transistor array panel of claim 4, wherein:
the first drain electrode includes:
a first portion which has a rod shape, is enclosed by the first source electrode and overlaps the first gate electrode;
a second portion which is connected to the first portion, is wider than the first portion and is between the first gate electrode and the extension electrode; and
a third portion which is connected to the second portion, has a rod shape, is narrower than the second portion and overlaps the extension electrode.

6. The thin film transistor array panel of claim 1, further comprising:
an auxiliary electrode which protrudes from the storage electrode line;
wherein
the first gate electrode and the second gate electrode are connected to each other,
the first source electrode protrudes from the data line and overlaps the first gate electrode, and the first drain electrode is spaced apart from the first source electrode,
the second source electrode is connected to the first source electrode and overlaps the second gate electrode, and the second drain electrode includes the drain electrode of the second thin film transistor which is spaced apart from the second source electrode,
the third gate electrode is spaced apart from the second gate electrode in the first direction,
the third source electrode includes the source electrode of the third thin film transistor which is connected to the second drain electrode and overlaps the third gate electrode, and
the third drain electrode is spaced apart from the third source electrode and overlaps the third gate electrode and the auxiliary electrode.

7. The thin film transistor array panel of claim 6, further comprising:
a connection electrode which connects the third drain electrode and the auxiliary electrode to each other.

8. The thin film transistor array panel of claim 6, wherein:
the second drain electrode and the third source electrode are between the second gate electrode and the third gate electrode which are spaced apart from each other.

9. The thin film transistor array panel of claim 8, wherein:
the first source electrode and the second source electrode are curved in a 'C' shape.

10. The thin film transistor array panel of claim 9, wherein:
the first drain electrode and the second drain electrode each include:
a first portion having a rod shape; and
a second portion which is connected to the first portion and is wider than the first portion,
the first portion of first drain electrode is enclosed by the first source electrode,
the first portion of the second drain electrode is enclosed by the second source electrode, and
the first portion of the second drain electrode is connected to the third source electrode via the second portion of the second drain electrode.

11. The thin film transistor array panel of claim 10, further comprising:
a gate insulating layer on the gate line, the first gate electrode, the second gate electrode and the third gate electrode; and
a passivation layer on the first, second and third source electrodes and on the first, second and third drain electrodes.

12. The thin film transistor array panel of claim 11, wherein
the passivation layer comprises:
a first contact hole which exposes a portion of the first drain electrode; and
a second contact hole which exposes a portion of the second drain electrode; and
the passivation layer and the gate insulating layer comprise a third contact hole which exposes a portion of the third drain electrode and a portion of the auxiliary electrode.

13. The thin film transistor array panel of claim 12, further comprising:
a connection electrode which is connected to the third drain electrode and the auxiliary electrode through the third contact hole,
wherein
the first subpixel electrode is connected to the first drain electrode through the first contact hole, and
the second subpixel electrode is connected to the second drain electrode through the second contact hole.

14. The thin film transistor array panel of claim 13, wherein:
the portion of the auxiliary electrode exposed by the third contact hole does not overlap the third drain electrode.

15. The thin film transistor array panel of claim 13, wherein:
the connection electrode includes a same material, and is in a same layer as the first subpixel electrode and the second subpixel electrode.

* * * * *